(12) United States Patent
Fukuyo et al.

(10) Patent No.: US 8,865,566 B2
(45) Date of Patent: Oct. 21, 2014

(54) METHOD OF CUTTING SEMICONDUCTOR SUBSTRATE

(71) Applicant: Hamamatsu Photonics K.K., Hamamatsu (JP)

(72) Inventors: Fumitsugu Fukuyo, Shizuoka (JP); Kenshi Fukumitsu, Shizuoka (JP); Naoki Uchiyama, Shizuoka (JP); Ryuji Sugiura, Shizuoka (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 54 days.

(21) Appl. No.: 13/829,683

(22) Filed: Mar. 14, 2013

(65) Prior Publication Data

US 2013/0252403 A1    Sep. 26, 2013

Related U.S. Application Data

(63) Continuation of application No. 13/206,181, filed on Aug. 9, 2011, now Pat. No. 8,409,968, which is a continuation of application No. 10/537,509, filed as application No. PCT/JP03/11624 on Sep. 11, 2003, now Pat. No. 8,263,479.

(30) Foreign Application Priority Data

Dec. 3, 2002 (JP) .................. P2002-351600

(51) Int. Cl.
*H01L 21/00* (2006.01)
*H01L 21/263* (2006.01)
(Continued)

(52) U.S. Cl.
CPC ........ *H01L 21/2633* (2013.01); *B23K 26/0057* (2013.01); *B23K 26/0853* (2013.01); *B23K 26/4075* (2013.01); *B28D 1/221* (2013.01);
(Continued)

(58) Field of Classification Search
USPC .................. 438/460, 463, 465; 257/E21.237
See application file for complete search history.

(56) References Cited

U.S. PATENT DOCUMENTS

| 3,448,510 A | 6/1969 | Bippus et al. |
| 3,543,979 A | 12/1970 | Grove et al. |

(Continued)

FOREIGN PATENT DOCUMENTS

| CN | 1160228 A | 9/1997 |
| DE | 196 46 332 A1 | 5/1998 |

(Continued)

OTHER PUBLICATIONS

K. Hirao et al., "Writing waveguides and gratings in silica and related materials by a femtosecond laser," Journal of Non-Crystalline Solids, vol. 239, Issues 1-3, Oct. 31, 1998, pp. 91-95.

(Continued)

*Primary Examiner* — Elias M Ullah
(74) *Attorney, Agent, or Firm* — Drinker Biddle & Reath LLP

(57) ABSTRACT

Multiphoton absorption is generated, so as to form a part which is intended to be cut 9 due to a molten processed region 13 within a silicon wafer 11, and then an adhesive sheet 20 bonded to the silicon wafer 11 is expanded. This cuts the silicon wafer 11 along the part which is intended to be cut 9 with a high precision into semiconductor chips 25. Here, opposing cut sections 25a, 25a of neighboring semiconductor chips 25, 25 are separated from each other from their close contact state, whereby a die-bonding resin layer 23 is also cut along the part which is intended to be cut 9. Therefore, the silicon wafer 11 and die-bonding resin layer 23 can be cut much more efficiently than in the case where the silicon wafer 11 and die-bonding resin layer 23 are cut with a blade without cutting a base 21.

12 Claims, 24 Drawing Sheets

(51) Int. Cl.
   *B23K 26/00*  (2014.01)
   *B23K 26/08*  (2014.01)
   *B23K 26/40*  (2014.01)
   *B28D 1/22*   (2006.01)
   *H01L 21/683* (2006.01)
   *H01L 21/78*  (2006.01)
   *H01L 23/00*  (2006.01)

(52) U.S. Cl.
   CPC ....... *H01L 21/6835* (2013.01); *H01L 21/6836* (2013.01); *H01L 21/78* (2013.01); *H01L 24/27* (2013.01); *H01L 24/83* (2013.01); *H01L 24/29* (2013.01); *B23K 2201/40* (2013.01); *H01L 2221/68327* (2013.01); *H01L 2221/68336* (2013.01); *H01L 2224/274* (2013.01); *H01L 2224/83191* (2013.01); *H01L 2224/8385* (2013.01); *H01L 2924/01005* (2013.01); *H01L 2924/01011* (2013.01); *H01L 2924/01013* (2013.01); *H01L 2924/01015* (2013.01); *H01L 2924/01027* (2013.01); *H01L 2924/0103* (2013.01); *H01L 2924/01033* (2013.01); *H01L 2924/01039* (2013.01); *H01L 2924/0106* (2013.01); *H01L 2924/01074* (2013.01); *H01L 2924/01075* (2013.01); *H01L 2924/01078* (2013.01); *H01L 2924/01082* (2013.01); *H01L 2924/07802* (2013.01); *H01L 2924/10329* (2013.01); *H01L 2924/01006* (2013.01); *H01L 2924/01023* (2013.01)
   USPC ..... 438/460; 438/463; 438/465; 257/E21.237

(56) References Cited

U.S. PATENT DOCUMENTS

| | | | |
|---|---|---|---|
| 3,610,871 A | 10/1971 | Lumley |
| 3,613,974 A | 10/1971 | Chatelain et al. |
| 3,626,141 A | 12/1971 | Daly |
| 3,629,545 A | 12/1971 | Graham et al. |
| 3,790,051 A | 2/1974 | Moore |
| 3,790,744 A | 2/1974 | Bowen |
| 3,824,678 A | 7/1974 | Harris et al. |
| 3,909,582 A | 9/1975 | Bowen |
| 3,970,819 A | 7/1976 | Gates et al. |
| 4,092,518 A | 5/1978 | Merard |
| 4,242,152 A | 12/1980 | Stone |
| 4,306,351 A | 12/1981 | Ohsaka et al. |
| 4,336,439 A | 6/1982 | Sasnett et al. |
| 4,475,027 A | 10/1984 | Pressley |
| 4,531,060 A | 7/1985 | Suwa et al. |
| 4,546,231 A | 10/1985 | Gresser et al. |
| 4,562,333 A | 12/1985 | Taub et al. |
| 4,650,619 A | 3/1987 | Watanabe |
| 4,682,003 A | 7/1987 | Minakawa et al. |
| 4,689,467 A | 8/1987 | Inoue |
| 4,691,093 A | 9/1987 | Banas et al. |
| 4,734,550 A | 3/1988 | Imamura et al. |
| 4,769,310 A | 9/1988 | Gugger et al. |
| 4,814,575 A | 3/1989 | Petitbon |
| 4,815,854 A | 3/1989 | Tanaka et al. |
| 4,899,126 A | 2/1990 | Yamada |
| 4,914,815 A | 4/1990 | Takada et al. |
| 4,981,525 A | 1/1991 | Kiyama et al. |
| 5,096,449 A | 3/1992 | Matsuzaki |
| 5,132,505 A | 7/1992 | Zonneveld et al. |
| 5,211,805 A | 5/1993 | Srinivasan |
| 5,230,184 A | 7/1993 | Bukhman |
| 5,251,003 A | 10/1993 | Vigouroux et al. |
| 5,254,149 A | 10/1993 | Hashemi et al. |
| 5,254,833 A | 10/1993 | Okiyama |
| 5,298,719 A | 3/1994 | Shafir |
| 5,304,357 A | 4/1994 | Sato et al. |
| 5,376,793 A | 12/1994 | Lesniak |
| 5,382,770 A | 1/1995 | Black et al. |
| 5,534,102 A | 7/1996 | Kadono et al. |
| 5,543,365 A | 8/1996 | Wills et al. |
| 5,575,936 A | 11/1996 | Goldfarb |
| 5,580,473 A | 12/1996 | Shinohara et al. |
| 5,609,284 A | 3/1997 | Kondratenko |
| 5,622,540 A | 4/1997 | Stevens |
| 5,637,244 A | 6/1997 | Erokhin |
| 5,641,416 A | 6/1997 | Chadha |
| 5,656,186 A | 8/1997 | Mourou et al. |
| 5,762,744 A | 6/1998 | Shibata et al. |
| 5,767,483 A | 6/1998 | Cameron et al. |
| 5,776,220 A | 7/1998 | Allaire et al. |
| 5,786,560 A | 7/1998 | Tatah et al. |
| 5,795,795 A | 8/1998 | Kousai et al. |
| 5,814,532 A | 9/1998 | Ichihara |
| 5,826,772 A | 10/1998 | Ariglio et al. |
| 5,841,543 A | 11/1998 | Guldi et al. |
| 5,882,956 A | 3/1999 | Umehara et al. |
| 5,886,319 A | 3/1999 | Preston et al. |
| 5,900,582 A | 5/1999 | Tomita et al. |
| 5,916,460 A | 6/1999 | Imoto et al. |
| 5,925,271 A | 7/1999 | Pollack et al. |
| 5,968,382 A | 10/1999 | Matsumoto et al. |
| 5,976,392 A | 11/1999 | Chen |
| 5,998,238 A | 12/1999 | Kosaki |
| 6,023,039 A | 2/2000 | Sawada |
| 6,031,201 A | 2/2000 | Amako et al. |
| 6,055,829 A | 5/2000 | Witzmann et al. |
| 6,057,525 A | 5/2000 | Chang et al. |
| 6,121,118 A | 9/2000 | Jin et al. |
| 6,127,005 A | 10/2000 | Lehman et al. |
| 6,156,030 A | 12/2000 | Neev |
| 6,172,329 B1 | 1/2001 | Shoemaker et al. |
| 6,175,096 B1 | 1/2001 | Nielsen |
| 6,181,728 B1 | 1/2001 | Cordingley et al. |
| 6,187,088 B1 | 2/2001 | Okumura |
| 6,211,488 B1 | 4/2001 | Hoekstra et al. |
| 6,229,113 B1 | 5/2001 | Brown |
| 6,229,114 B1 | 5/2001 | Andrews et al. |
| 6,236,446 B1 | 5/2001 | Izumi et al. |
| 6,252,197 B1 | 6/2001 | Hoekstra et al. |
| 6,257,224 B1 | 7/2001 | Yoshino et al. |
| 6,259,058 B1 | 7/2001 | Hoekstra |
| 6,285,002 B1 | 9/2001 | Ngoi et al. |
| 6,294,439 B1 | 9/2001 | Sasaki et al. |
| 6,322,958 B1 | 11/2001 | Hayashi |
| 6,325,855 B1 | 12/2001 | Sillmon et al. |
| 6,333,486 B1 | 12/2001 | Troitski |
| 6,344,402 B1 | 2/2002 | Sekiya |
| 6,359,254 B1 | 3/2002 | Brown |
| 6,376,797 B1 | 4/2002 | Piwczyk et al. |
| 6,402,004 B1 | 6/2002 | Yoshikuni et al. |
| 6,407,363 B2 | 6/2002 | Dunsky et al. |
| 6,420,678 B1 | 7/2002 | Hoekstra |
| 6,438,996 B1 | 8/2002 | Cuvelier |
| 6,489,588 B1 | 12/2002 | Hoekstra et al. |
| 6,562,698 B2 | 5/2003 | Manor |
| 6,566,683 B1 | 5/2003 | Ogawa et al. |
| 6,653,210 B2 | 11/2003 | Choo et al. |
| 6,726,631 B2 | 4/2004 | Hatangadi et al. |
| 6,744,009 B1 | 6/2004 | Xuan et al. |
| 6,770,544 B2 | 8/2004 | Sawada |
| 6,787,732 B1 | 9/2004 | Xuan et al. |
| 6,908,784 B1 | 6/2005 | Farnworth et al. |
| 6,951,799 B2 | 10/2005 | Roche |
| 6,992,026 B2 | 1/2006 | Fukuyo et al. |
| 7,174,620 B2 | 2/2007 | Chiba et al. |
| 7,396,742 B2 | 7/2008 | Fukuyo et al. |
| 7,489,454 B2 | 2/2009 | Fukuyo et al. |
| 7,547,613 B2 | 6/2009 | Fukuyo et al. |
| 7,566,635 B2 | 7/2009 | Fujii et al. |
| 7,592,237 B2 | 9/2009 | Sakamoto et al. |
| 7,592,238 B2 | 9/2009 | Fukuyo et al. |
| 7,605,344 B2 | 10/2009 | Fukumitsu |
| 7,608,214 B2 | 10/2009 | Kuno et al. |
| 7,615,721 B2 | 11/2009 | Fukuyo et al. |
| 7,626,137 B2 | 12/2009 | Fukuyo et al. |
| 7,709,767 B2 | 5/2010 | Sakamoto |
| 7,718,510 B2 | 5/2010 | Sakamoto et al. |

(56) References Cited

U.S. PATENT DOCUMENTS

| | | |
|---|---|---|
| 7,719,017 B2 | 5/2010 | Tanaka |
| 7,732,730 B2 | 6/2010 | Fukuyo et al. |
| 7,749,867 B2 | 7/2010 | Fukuyo et al. |
| 7,754,583 B2 | 7/2010 | Sakamoto |
| 7,825,350 B2 | 11/2010 | Fukuyo et al. |
| 7,897,487 B2 | 3/2011 | Sugiura et al. |
| 7,902,636 B2 | 3/2011 | Sugiura et al. |
| 7,939,430 B2 | 5/2011 | Sakamoto et al. |
| 7,947,574 B2 | 5/2011 | Sakamoto et al. |
| 7,989,320 B2 | 8/2011 | Boyle et al. |
| 2001/0029673 A1 | 10/2001 | Brown et al. |
| 2001/0035401 A1 | 11/2001 | Manor |
| 2001/0046112 A1 | 11/2001 | Herchen |
| 2002/0006765 A1 | 1/2002 | Michel et al. |
| 2002/0025432 A1 | 2/2002 | Noguchi et al. |
| 2002/0096994 A1 | 7/2002 | Iwafuchi et al. |
| 2002/0115235 A1 | 8/2002 | Sawada |
| 2002/0158288 A1 | 10/2002 | Yamazaki et al. |
| 2002/0170896 A1 | 11/2002 | Choo et al. |
| 2002/0177288 A1 | 11/2002 | Brown et al. |
| 2003/0010275 A1 | 1/2003 | Radojevic et al. |
| 2003/0024909 A1 | 2/2003 | Hoekstra et al. |
| 2003/0141570 A1 | 7/2003 | Chen et al. |
| 2004/0002199 A1 | 1/2004 | Fukuyo et al. |
| 2004/0245659 A1 | 12/2004 | Glenn et al. |
| 2005/0173387 A1 | 8/2005 | Fukuyo et al. |
| 2005/0181581 A1 | 8/2005 | Fukuyo et al. |
| 2005/0184037 A1 | 8/2005 | Fukuyo et al. |
| 2005/0189330 A1 | 9/2005 | Fukuyo et al. |
| 2005/0194364 A1 | 9/2005 | Fukuyo et al. |
| 2005/0202596 A1 | 9/2005 | Fukuyo et al. |
| 2005/0272223 A1 | 12/2005 | Fujii et al. |
| 2005/0282359 A1 | 12/2005 | Nagai et al. |
| 2006/0011593 A1 | 1/2006 | Fukuyo et al. |
| 2006/0040473 A1 | 2/2006 | Fukuyo et al. |
| 2006/0121697 A1 | 6/2006 | Fujii et al. |
| 2006/0144828 A1 | 7/2006 | Fukumitsu et al. |
| 2006/0148212 A1 | 7/2006 | Fukuyo et al. |
| 2006/0160331 A1 | 7/2006 | Fukuyo et al. |
| 2006/0255024 A1 | 11/2006 | Fukuyo et al. |
| 2007/0085099 A1 | 4/2007 | Fukumitsu et al. |
| 2007/0125757 A1 | 6/2007 | Fukuyo et al. |
| 2007/0158314 A1 | 7/2007 | Fukumitsu et al. |
| 2007/0252154 A1 | 11/2007 | Uchiyama et al. |
| 2008/0035611 A1 | 2/2008 | Kuno et al. |
| 2008/0037003 A1 | 2/2008 | Atsumi et al. |
| 2008/0090382 A1 | 4/2008 | Fujii et al. |
| 2008/0218735 A1 | 9/2008 | Atsumi et al. |
| 2008/0251506 A1 | 10/2008 | Atsumi et al. |
| 2009/0008373 A1 | 1/2009 | Muramatsu et al. |
| 2009/0032509 A1 | 2/2009 | Kuno et al. |
| 2009/0098713 A1 | 4/2009 | Sakamoto |
| 2009/0107967 A1 | 4/2009 | Sakamoto et al. |
| 2009/0117712 A1 | 5/2009 | Sakamoto et al. |
| 2009/0166342 A1 | 7/2009 | Kuno et al. |
| 2009/0166808 A1 | 7/2009 | Sakamoto et al. |
| 2009/0250446 A1 | 10/2009 | Sakamoto |
| 2009/0261083 A1 | 10/2009 | Osajima et al. |
| 2009/0302428 A1 | 12/2009 | Sakamoto et al. |
| 2010/0006548 A1 | 1/2010 | Atsumi et al. |
| 2010/0009547 A1 | 1/2010 | Sakamoto |
| 2010/0012632 A1 | 1/2010 | Sakamoto |
| 2010/0012633 A1 | 1/2010 | Atsumi et al. |
| 2010/0015783 A1 | 1/2010 | Fukuyo et al. |
| 2010/0025386 A1 | 2/2010 | Kuno et al. |
| 2010/0032418 A1 | 2/2010 | Kuno et al. |
| 2010/0055876 A1 | 3/2010 | Fukuyo et al. |
| 2010/0151202 A1 | 6/2010 | Fukumitsu |
| 2010/0176100 A1 | 7/2010 | Fukuyo et al. |
| 2010/0184271 A1 | 7/2010 | Sugiura et al. |
| 2010/0200550 A1 | 8/2010 | Kumagai |
| 2010/0203678 A1 | 8/2010 | Fukumitsu et al. |
| 2010/0203707 A1 | 8/2010 | Fujii et al. |
| 2010/0227453 A1 | 9/2010 | Sakamoto |
| 2010/0240159 A1 | 9/2010 | Kumagai et al. |
| 2010/0258539 A1 | 10/2010 | Sakamoto |
| 2010/0301521 A1 | 12/2010 | Uchiyama |
| 2010/0311313 A1 | 12/2010 | Uchiyama |
| 2010/0327416 A1 | 12/2010 | Fukumitsu |
| 2011/0000897 A1 | 1/2011 | Nakano et al. |
| 2011/0001220 A1 | 1/2011 | Sugiura et al. |
| 2011/0021004 A1 | 1/2011 | Fukuyo et al. |
| 2011/0027971 A1 | 2/2011 | Fukuyo et al. |
| 2011/0027972 A1 | 2/2011 | Fukuyo et al. |
| 2011/0037149 A1 | 2/2011 | Fukuyo et al. |
| 2011/0274128 A1 | 11/2011 | Fukumitsu et al. |
| 2011/0306182 A1 | 12/2011 | Fukuyo et al. |
| 2012/0190175 A1 | 7/2012 | Fukuyo et al. |
| 2012/0205357 A1 | 8/2012 | Fukuyo et al. |
| 2012/0205358 A1 | 8/2012 | Fukuyo et al. |
| 2012/0228276 A1 | 9/2012 | Fukuyo et al. |
| 2012/0279947 A1 | 11/2012 | Fukuyo et al. |
| 2012/0329248 A1 | 12/2012 | Fukuyo et al. |
| 2013/0009284 A1 | 1/2013 | Fujii et al. |
| 2013/0012000 A1 | 1/2013 | Fujii et al. |
| 2013/0015167 A1 | 1/2013 | Fujii et al. |
| 2013/0017670 A1 | 1/2013 | Fukuyo et al. |

FOREIGN PATENT DOCUMENTS

| | | |
|---|---|---|
| EP | 0 213 546 A2 | 3/1987 |
| EP | 0345752 A2 | 12/1989 |
| EP | 0 863 231 A1 | 9/1998 |
| EP | 1 022 778 A1 | 7/2000 |
| EP | 1 026 735 A2 | 8/2000 |
| EP | 1 138 516 A2 | 10/2001 |
| EP | 1 338 371 A1 | 8/2003 |
| EP | 1 498 216 A1 | 1/2005 |
| EP | 1 580 800 A1 | 9/2005 |
| GB | 2 322 006 A | 8/1998 |
| JP | 46-024989 Y1 | 7/1971 |
| JP | 48-012599 Y1 | 2/1973 |
| JP | 53-033050 A | 3/1978 |
| JP | 53-141573 A | 12/1978 |
| JP | 56-028630 A | 3/1981 |
| JP | 56-076522 A | 6/1981 |
| JP | 56-128691 A | 10/1981 |
| JP | 58-036939 A | 3/1983 |
| JP | 58-057767 A | 4/1983 |
| JP | 58-171783 A | 10/1983 |
| JP | 58-181492 A | 10/1983 |
| JP | 59-076687 A | 5/1984 |
| JP | 59-130438 A | 7/1984 |
| JP | 59-141233 A | 8/1984 |
| JP | 59-150691 A | 8/1984 |
| JP | 60-055640 A | 3/1985 |
| JP | 60-144985 A | 7/1985 |
| JP | 60-167351 A | 8/1985 |
| JP | 61-096439 A | 5/1986 |
| JP | 61-112345 A | 5/1986 |
| JP | 61-121453 A | 6/1986 |
| JP | 61-220339 A | 9/1986 |
| JP | 62-004341 A | 1/1987 |
| JP | 62-098684 A | 5/1987 |
| JP | 63-215390 A | 9/1988 |
| JP | 63-278692 A | 11/1988 |
| JP | 64-038209 | 2/1989 |
| JP | 01-112130 A | 4/1989 |
| JP | 01-225509 A | 9/1989 |
| JP | 01-225510 A | 9/1989 |
| JP | 03-124486 A | 5/1991 |
| JP | 03-234043 A | 10/1991 |
| JP | 03-276662 A | 12/1991 |
| JP | 03-281073 A | 12/1991 |
| JP | 04-029352 A | 1/1992 |
| JP | 04-111800 A | 4/1992 |
| JP | 04-167985 A | 6/1992 |
| JP | 04-188847 A | 7/1992 |
| JP | 04-300084 A | 10/1992 |
| JP | 04-339586 A | 11/1992 |
| JP | 04-356942 A | 12/1992 |
| JP | 05-335726 A | 12/1993 |
| JP | 06-039572 A | 2/1994 |
| JP | 06-188310 A | 7/1994 |

(56) References Cited

FOREIGN PATENT DOCUMENTS

| | | |
|---|---|---|
| JP | 06-198475 A | 7/1994 |
| JP | 07-029855 A | 1/1995 |
| JP | 07-032281 A | 2/1995 |
| JP | 07-037840 A | 2/1995 |
| JP | 07-040336 A | 2/1995 |
| JP | 07-075955 A | 3/1995 |
| JP | 07-076167 A | 3/1995 |
| JP | 07-263382 A | 10/1995 |
| JP | 07-308791 A | 11/1995 |
| JP | 08-148692 A | 6/1996 |
| JP | 08-197271 A | 8/1996 |
| JP | 08-264488 A | 10/1996 |
| JP | 08-264491 A | 10/1996 |
| JP | 09-017756 A | 1/1997 |
| JP | 09-017831 A | 1/1997 |
| JP | 09-150286 A | 6/1997 |
| JP | 09-213662 A | 8/1997 |
| JP | 09-216085 A | 8/1997 |
| JP | 09-260310 A | 10/1997 |
| JP | 09-263734 A | 10/1997 |
| JP | 10-034359 A | 2/1998 |
| JP | 10-071483 A | 3/1998 |
| JP | 10-163780 A | 6/1998 |
| JP | 10-214997 A | 8/1998 |
| JP | 10-233373 A | 9/1998 |
| JP | 10-305420 A | 11/1998 |
| JP | 10-321908 A | 12/1998 |
| JP | 11-028586 A | 2/1999 |
| JP | 11-071124 A | 3/1999 |
| JP | 11-121517 A | 4/1999 |
| JP | 11-138896 A | 5/1999 |
| JP | 11-156564 A | 6/1999 |
| JP | 11-160667 A | 6/1999 |
| JP | 11-162889 A | 6/1999 |
| JP | 11-163097 A | 6/1999 |
| JP | 11-163403 A | 6/1999 |
| JP | 11-177137 A | 7/1999 |
| JP | 11-177176 A | 7/1999 |
| JP | 11-204551 A | 7/1999 |
| JP | 11-207479 A | 8/1999 |
| JP | 11-221684 A | 8/1999 |
| JP | 11-224866 A | 8/1999 |
| JP | 11-267861 A | 10/1999 |
| JP | 2000-009991 A | 1/2000 |
| JP | 2000-015467 A | 1/2000 |
| JP | 2000-042764 A | 2/2000 |
| JP | 2000-061677 A | 2/2000 |
| JP | 2000-104040 A | 4/2000 |
| JP | 2000-124537 A | 4/2000 |
| JP | 2000-158156 A | 6/2000 |
| JP | 2000-195828 A | 7/2000 |
| JP | 2000-210785 A | 8/2000 |
| JP | 2000-216114 A | 8/2000 |
| JP | 2000-219528 A | 8/2000 |
| JP | 2000-237885 A | 9/2000 |
| JP | 2000-237886 A | 9/2000 |
| JP | 2000-247671 A | 9/2000 |
| JP | 2000-249859 A | 9/2000 |
| JP | 2000-294522 A | 10/2000 |
| JP | 2000-323441 A | 11/2000 |
| JP | 2000-349107 A | 12/2000 |
| JP | 2001-047264 A | 2/2001 |
| JP | 2001-064029 A | 3/2001 |
| JP | 2001-085736 A | 3/2001 |
| JP | 2001-127015 A | 5/2001 |
| JP | 2001-135654 A | 5/2001 |
| JP | 2001-144140 A | 5/2001 |
| JP | 2001-196282 A | 7/2001 |
| JP | 2001-250798 A | 9/2001 |
| JP | 2001-284292 A | 10/2001 |
| JP | 2001-326194 A | 11/2001 |
| JP | 2001-345252 A | 12/2001 |
| JP | 2002-026443 A | 1/2002 |
| JP | 2002-047025 A | 2/2002 |
| JP | 2002-050589 A | 2/2002 |
| JP | 2002-158276 A | 5/2002 |
| JP | 2002-192367 A | 7/2002 |
| JP | 2002-192368 A | 7/2002 |
| JP | 2002-192369 A | 7/2002 |
| JP | 2002-192370 A | 7/2002 |
| JP | 2002-192371 A | 7/2002 |
| JP | 2002-205180 A | 7/2002 |
| JP | 2002-205181 A | 7/2002 |
| JP | 2002-224878 A | 8/2002 |
| JP | 2002-226796 A | 8/2002 |
| JP | 2003-001458 A | 1/2003 |
| JP | 2003-017790 A | 1/2003 |
| JP | 2003-039184 A | 2/2003 |
| JP | 2003-046177 A | 2/2003 |
| JP | 2003-154517 A | 5/2003 |
| JP | 2003-334812 A | 11/2003 |
| JP | 2003-338467 A | 11/2003 |
| JP | 2003-338468 A | 11/2003 |
| JP | 2003-338636 A | 11/2003 |
| JP | 2005-001001 A | 1/2005 |
| JP | 2005-047290 A | 2/2005 |
| JP | 2005-159378 A | 6/2005 |
| JP | 2005-159379 A | 6/2005 |
| JP | 2005-313237 A | 11/2005 |
| JP | 2006-128723 A | 5/2006 |
| JP | 2006-135355 A | 5/2006 |
| KR | 2001-017690 | 8/1999 |
| KR | 10-1999-0072974 | 9/1999 |
| KR | 2001-0017690 A | 3/2001 |
| TW | 165354 | 8/1991 |
| TW | 192484 | 10/1992 |
| TW | 219906 | 2/1994 |
| TW | 404871 B | 9/2000 |
| TW | 415036 B | 12/2000 |
| TW | 428295 B | 4/2001 |
| TW | 440551 B | 6/2001 |
| TW | 443581 U | 6/2001 |
| TW | 445684 B | 7/2001 |
| TW | 455914 B | 9/2001 |
| TW | 473896 B | 1/2002 |
| TW | 488001 B | 5/2002 |
| TW | 512451 B | 12/2002 |
| TW | 521310 B | 2/2003 |
| WO | WO-97/07927 A1 | 3/1997 |
| WO | WO-00/32349 A1 | 6/2000 |
| WO | WO-01/90709 A1 | 11/2001 |
| WO | WO-02/07927 A1 | 1/2002 |
| WO | WO-02/22301 A1 | 3/2002 |
| WO | WO-03/076118 A1 | 9/2003 |
| WO | WO-2004/082006 A1 | 9/2004 |

OTHER PUBLICATIONS

T. Yajima et al., *New Version Laser Handbook*, published by Asakura Shoten, Jun. 15, 1989, pp. 666-669.
*Tooling Machine Series, Laser Machining*, published by Taiga Shuppan, Inc., Sep. 10, 1990, pp. 91-96.
*Electronic Material*, No. 9, on 2002, published by Kogyo Chousakai, pp. 17-21 (with full English translation).
F. Fukuyo et al., "Stealth Dicing Technology for Ultra Thin Wafer," presented at 2003 ICEP (International Conference on Electronics Packaging), Apr. 16-18, 2003, Tokyo, Japan.
K. Hayashi, "Inner Glass Marking by Harmonics of Solid-state Laser," Proceedings of 45th Laser Materials Processing Conference, Dec. 1998, pp. 23-28.
T. Sano et al., "Evaluation of Processing Characteristics of Silicon with Picosecond Pulse Laser," Preprints of the National Meeting of Japan Welding Society, No. 66, Apr. 2000, pp. 72-73.
K. Miura et al., "Formation of Photo-induced Structures in Glasses with Femtosecond Laser," Proceedings of 42nd Laser Materials Processing Conference, Nov. 1997, pp. 105-111.
T. Miyazaki, "Laser Beam Machining Technology," published by Sangyo-Tosho Inc. on May 31, 1991, First Edition, pp. 9-10.
K. Midorikawa, "Recent Progress of Femtosecond Lasers and Their Applications to Materials Processing," Dec. 31, 1998, pp. 29-38, ISBN: 4-947684-21-6, including English Language Abstract.
Journal of Japan Laser Processing Society, vol. 12, No. 1, Feb. 2005, pp. 15-23 (w/English language translation).

(56) References Cited

OTHER PUBLICATIONS

Proceedings of the 63rd Laser Materials Processing Conference, May 2005, pp. 115-123.
A. Ishii et al., CO2 Laser Processing Technology, Nikkan Kogyo Publishing Production, Dec. 21, 1992, pp. 63-65 (with partial English translation).
Journal of the Japan Society of Griding Engineers, vol. 47, No. 5, May (2003), pp. 229-231 (including English language translation).
The 6th International Symposium on Laser Precision Microfabrication, Apr. 2005.
X. Liu et al., "Laser Ablation and Micromachining with Ultrashort Laser Pulses," IEEE Journal of Quantum Electronics, vol. 33, No. 10, Oct. 1997, pp. 1706-1716.
Office Action dated Apr. 25, 2012 from related (not counterpart) U.S. Appl. No. 12/912,427 (33 pages).
U.S. Appl. No. 13/269,274, filed Oct. 7, 2011.
U.S. Appl. No. 13/235,936, filed Sep. 19, 2011.
U.S. Appl. No. 13/213,175, filed Aug. 19, 2011.
U.S. Appl. No. 13/233,662, filed Sep. 15, 2011.
U.S. Appl. No. 13/061,438, filed Apr. 26, 2011.
U.S. Appl. No. 13/107,056, filed May 13, 2011.
U.S. Appl. No. 13/151,877, filed Jun. 2, 2011.
U.S. Appl. No. 13/131,429, filed Jun. 28, 2011.
U.S. Appl. No. 13/143,636, filed Sep. 21, 2011.
U.S. Appl. No. 13/148,097, filed Aug. 26, 2011.
U.S. Appl. No. 13/262,995, filed Oct. 5, 2011.
U.S. Appl. No. 13/265,027, filed Oct. 18, 2011.
Singaporean Search Report dated Oct. 8, 2012 issued in related (not counterpart) SG Patent Application No. 200906169-8.
U.S. Appl. No. 13/614,042, filed Sep. 13, 2012.
U.S. Office Action dated Jun. 18, 2013 issued in U.S. Appl. No. 10/548,522.
U.S. Office Action dated Sep. 3, 2010 in U.S. Appl. No. 12/762,444.
U.S. Office Action dated Oct. 6, 2010 in U.S. Appl. No. 11/987,328.
U.S. Office Action dated May 28, 2013 issued in U.S. Appl. No. 13/529,525.

METHOD OF CUTTING SEMICONDUCTOR SUBSTRATE

This is a continuation application of copending application Ser. No. 13/206,181, filed on Aug. 9, 2011, which is a continuation application of application Ser. No. 10/537,509, filed on Nov. 30, 2005, now U.S. Pat. No. 8,263,479, issued Sep. 11, 2012, which is a national stage application of PCT Application No. PCT/JP03/11624 filed on Sep. 11, 2003, designating the U.S.A., the entire contents of each of which are incorporated by reference herein in their entirety.

TECHNICAL FIELD

The present invention relates to a method of cutting a semiconductor substrate used for cutting a semiconductor substrate in semiconductor device manufacturing processes and the like.

BACKGROUND ART

As a conventional technique of this kind, Japanese Patent Application Laid-Open Nos. 2002-158276 and 2000-104040 disclose the following technique. Mist, an adhesive sheet is bonded to the rear face of a semiconductor wafer by way of a die-bonding resin layer, and the semiconductor wafer is cut with a blade while in a state where the semiconductor wafer is held on the adhesive sheet, so as to yield semiconductor chips. Subsequently, when picking up the semiconductor chips on the adhesive sheet, the die-bonding resin is peeled off together with the individual semiconductor chips. This can bond the semiconductor chips onto a lead frame while omitting the step of applying an adhesive to the rear faces of semiconductor chips, and so forth.

When cutting the semiconductor wafer held on the adhesive sheet with the blade in the above-mentioned technique, however, the die-bonding resin layer existing between the semiconductor wafer and adhesive sheet is needed to be cut surely without cutting the adhesive sheet. Therefore, particular care must be taken when cutting a semiconductor wafer with a blade in such a case.

DISCLOSURE OF THE INVENTION

In view of such circumstances, it is an object of the present invention to provide a method of cutting a semiconductor substrate which can efficiently cut a semiconductor substrate with a die-bonding resin layer.

For achieving the above-mentioned object, in one aspect, the present invention provides a method of cutting a semiconductor substrate, the method comprising the steps of irradiating a semiconductor substrate having a sheet bonded thereto by way of a die-bonding resin layer with laser light while locating a light-converging point within the semiconductor substrate, so as to form a modified region caused by multiphoton absorption within the semiconductor substrate, and causing the modified region to form a part which is intended to be cut; and expanding the sheet after the step of forming the part which is intended to be cut, so as to cut the semiconductor substrate and die-bonding resin layer along the part which is intended to be cut.

This method of cutting a semiconductor substrate irradiates the semiconductor substrate with laser light while locating a light-converging point within the semiconductor substrate, and generates a phenomenon of multiphoton absorption within the semiconductor substrate, so as to form a modified region, whereby the modified region can form a part which is intended to be cut within the semiconductor substrate along a desirable line to cut for cutting the semiconductor substrate. When the part which is intended to be cut is formed within the semiconductor substrate as such, a relatively small force can start fractures in the thickness direction of the semiconductor substrate from the part which is intended to be cut. Therefore, when the sheet bonded to the semiconductor substrate is expanded, the semiconductor substrate can be cut with a high precision along the part which is intended to be cut. Here, opposing cut sections of the cut semiconductor substrate are initially in close contact with each other, but are separated from each other as the sheet expands, whereby the die-bonding resin layer existing between the semiconductor substrate and the sheet is also cut along the part which is intended to be cut. Therefore, the semiconductor substrate and die-bonding resin layer can be cut along the part which is intended to be cut much more efficiently than in the case where the semiconductor substrate and die-bonding resin layer are cut with a blade while leaving the sheet. Also, since the opposing cut sections of the cut semiconductor substrate are initially in close contact with each other, the cut pieces of the semiconductor substrate and cut pieces of the die-bonding resin layer have substantially the same outer form, whereby the die-bonding resin is prevented from protruding from the cut sections of the semiconductor substrate.

In another aspect, the present invention provides a method of cutting a semiconductor substrate, the method comprising the steps of irradiating a semiconductor substrate having a sheet bonded thereto by way of a die-bonding resin layer with laser light while locating a light-converging point within the semiconductor substrate under a condition with a peak power density of at least $1 \times 10^8$ (W/cm$^2$) at the light-converging point and a pulse width of 1 µs or less, so as to form a modified region including a molten processed region within the semiconductor substrate, and causing the modified region including the molten processed region to form a part which is intended to be cut; and expanding the sheet after the step of forming the part which is intended to be cut, so as to cut the semiconductor substrate and die-bonding resin layer along the part which is intended to be cut.

This method of cutting a semiconductor substrate irradiates the semiconductor substrate with laser light while locating a light-converging point within the semiconductor substrate under a condition with a peak power density of at least $1 \times 10^8$ (W/cm$^2$) at the light-converging point and a pulse width of 1 µs or less. Therefore, the inside of the semiconductor substrate is locally heated by multiphoton absorption. This heat forms a molten processed region within the semiconductor substrate. Since the molten processed region is an example of the above-mentioned modified region, the semiconductor substrate and die-bonding resin layer can also be cut along the part which is intended to be cut much more efficiently in this method of cutting a semiconductor substrate than in the case where the semiconductor substrate and die-bonding resin layer are cut with a blade while leaving the sheet.

In still another aspect, the present invention provides a method of cutting a semiconductor substrate, the method comprising the steps of irradiating a semiconductor substrate having a sheet bonded thereto by way of a die-bonding resin layer with laser light while locating a light-converging point within the semiconductor substrate, so as to form a modified region within the semiconductor substrate, and causing the modified region to form a part which is intended to be cut; and expanding the sheet after the step of forming the part which is intended to be cut, so as to cut the semiconductor substrate and die-bonding resin layer along the part which is intended to be cut. The modified region may be a molten processed region.

Because of the same reason as with the above-mentioned methods of cutting a semiconductor substrate, the semiconductor substrate and die-bonding resin layer can also be cut along the part which is intended to be cut much more efficiently in this method of cutting a semiconductor substrate than in the case where the semiconductor substrate and die-bonding resin layer are cut with a blade while leaving the sheet. The modified region may be formed by multiphoton absorption or other causes.

In still another aspect, the present invention provides a method of cutting a semiconductor substrate, the method comprising the steps of irradiating a semiconductor substrate having a sheet bonded thereto with laser light while locating a light-converging point within the semiconductor substrate, so as to form a modified region within the semiconductor substrate, and causing the modified region to form a part which is intended to be cut; and expanding the sheet after the step of forming the part which is intended to be cut, so as to cut the semiconductor substrate along the part which is intended to be cut.

This method of cutting a semiconductor substrate can cut the semiconductor substrate along the part which is intended to be cut much more efficiently than in the case where the semiconductor substrate is cut with a blade while leaving the sheet.

In the step of forming the part which is intended to be cut in any of the above-mentioned methods of cutting a semiconductor substrate in accordance with the present invention, a fracture may be caused to reach a front face of the semiconductor substrate on the laser light entrance side from the part which is intended to be cut acting as a start point, a fracture may be caused to reach a rear face of the semiconductor substrate on the side opposite from the laser light entrance side from the part which is intended to be cut acting as a start point, or a fracture may be caused to reach the front face of the semiconductor substrate on the laser light entrance side and the rear face on the side opposite therefrom from the part which is intended to be cut acting as a start point.

In still another aspect, the present invention provides a method of cutting a semiconductor substrate, the method comprising the steps of irradiating a semiconductor substrate having a sheet bonded thereto by way of a die-bonding resin layer with laser light while locating a light-converging point within the semiconductor substrate, so as to form a modified region caused by multiphoton absorption within the semiconductor substrate, and causing the modified region to form a part which is intended to be cut; generating a stress in the semiconductor substrate along the part which is intended to be cut after the step of forming the part which is intended to be cut, so as to cut the semiconductor substrate along the part which is intended to be cut; and expanding the sheet after the step of cutting the semiconductor substrate, so as to cut the die-bonding resin layer along a cut section of the semiconductor substrate.

The modified region caused by multiphoton absorption can form a part which is intended to be cut within the semiconductor substrate along a desirable line to cut for cutting the semiconductor substrate in this method of cutting a semiconductor substrate as well. Therefore, when a stress is generated in the semiconductor substrate along the part which is intended to be cut, the semiconductor substrate can be cut with a high precision along the part which is intended to be cut. Then, when the sheet bonded to the semiconductor substrate is expanded, opposing cut sections of the cut semiconductor substrate are separated from each other from their close contact state as the sheet expands, whereby the die-bonding resin layer existing between the semiconductor substrate and sheet is cut along the cut sections of the semiconductor substrate. Therefore, the semiconductor substrate and die-bonding resin layer can be cut along the part which is intended to be cut much more efficiently than in the case where the semiconductor substrate and die-bonding resin layer are cut with a blade while leaving the sheet. Also, since the opposing cut sections of the cut semiconductor substrate are initially in close contact with each other, the cut pieces of the semiconductor substrate and cut pieces of the die-bonding resin layer have substantially the same outer form, whereby the die-bonding resin is prevented from protruding from the cut sections of the semiconductor substrate.

In still another aspect, the present invention provides a method of cutting a semiconductor substrate, the method comprising the steps of irradiating a semiconductor substrate having a sheet bonded thereto by way of a die-bonding resin layer with laser light while locating a light-converging point within the semiconductor substrate under a condition with a peak power density of at least $1 \times 10^8$ (W/cm$^2$) at the light-converging point and a pulse width of 1 µs or less, so as to form a modified region caused by multiphoton absorption within the semiconductor substrate, and causing the modified region to form a part which is intended to be cut; generating a stress in the semiconductor substrate along the part which is intended to be cut after the step of forming the part which is intended to be cut, so as to cut the semiconductor substrate along the part which is intended to be cut; and expanding the sheet after the step of cutting the semiconductor substrate, so as to cut the die bonding resin layer along a cut section of the semiconductor substrate.

In still another aspect, the present invention provides a method of cutting a semiconductor substrate, the method comprising the steps of irradiating a semiconductor substrate having a sheet bonded thereto by way of a die-bonding resin layer with laser light while locating a light-converging point within the semiconductor substrate, so as to form a modified region within the semiconductor substrate, and causing the modified region to form a part which is intended to be cut; generating a stress in the semiconductor substrate along the pad which is intended to be cut after the step of forming the part which is intended to be cut, so as to cut the semiconductor substrate along the part which is intended to be cut; and expanding the sheet after the step of cutting the semiconductor substrate, so as to cut the die-bonding resin layer along a cut section of the semiconductor substrate. The modified region may be a molten processed region.

Because of the same reason as with the above-mentioned methods of cutting a semiconductor substrate, the semiconductor substrate and die-bonding resin layer can also be cut along the part which is intended to be cut much more efficiently in this method of cutting a semiconductor substrate than in the case where the semiconductor substrate and die-bonding resin layer are cut with a blade while leaving the sheet.

In still another aspect, for achieving the above-mentioned object, the present invention provides a method of cutting a semiconductor substrate having a front face formed with a functional device along a line to cut, the method comprising the steps of irradiating the semiconductor substrate with laser light while using a rear face of the semiconductor substrate as a laser light entrance surface and locating a light-converging point within the semiconductor substrate, so as to form a modified region, and causing the modified region to form a cutting start region within the semiconductor substrate inside of the laser light entrance surface by a predetermined distance along the line to cut; attaching an expandable holding member to the rear face of the semiconductor substrate by way of a die-bonding resin layer after forming the cutting start region; and expanding the holding member after attaching the holding member, so as to cut the semiconductor substrate and die-bonding resin layer along the line to cut.

The object to be processed in this method of cutting a semiconductor substrate is a semiconductor substrate having the front face formed with a functional device. Using the rear face of such a semiconductor substrate as a laser light entrance surface, the semiconductor substrate is irradiated with laser light while locating a light-converging point within the semiconductor substrate, so as to generate multiphoton absorption or optical absorption equivalent thereto, thereby forming a cut start region caused by a modified region within the semiconductor substrate along the line to cut. Here, the rear face of the semiconductor substrate is used as the laser light entrance surface, since there will be a fear of the functional device inhibiting the laser light from entering if the front face is employed as the laser light entrance surface. When the cutting start region is formed within the semiconductor substrate as such, a fracture can start from the cutting start region naturally or with a relatively small force applied thereto, so as to reach the front and rear faces of the semiconductor substrate. Therefore, when an expandable holding member is attached to the rear face of the semiconductor substrate by way of a die-bonding resin layer and expanded after forming the cut start region, cut sections of the semiconductor substrate cut along the lines to cut are separated from each other from their close contact state as the holding member expands. As a consequence, the die-bonding resin layer existing between the semiconductor substrate and holding member is also cut along the line to cut. Therefore, the semiconductor substrate and die-bonding resin layer can be cut along the line to cut much more efficiently than in the case of cutting with a blade or the like. Also, since the opposing cut sections of the cut semiconductor substrate are initially in close contact with each other, the cut pieces of the semiconductor substrate and cut pieces of the die-bonding resin layer have substantially the same outer form, whereby the die-bonding resin is prevented from protruding from the cut sections of the semiconductor substrate.

The functional device refers to semiconductor operating layers formed by crystal growth, light-receiving devices such as photodiodes, light-emitting devices such as laser diodes, and circuit devices formed as circuits, for example.

Preferably, the method further comprises the step of grinding the rear face of the semiconductor substrate such that the semiconductor substrate attains a predetermined thickness before forming the cutting start region. When the rear face of the semiconductor substrate is ground beforehand such that the semiconductor substrate attains a predetermined thickness as such, the semiconductor substrate and die-bonding resin layer can be cut along the line to cut with a higher precision. Here, the grinding encompasses cutting, polishing, chemical etching, etc.

The modified region may include a molten processed region. When the object to be processed is a semiconductor substrate, a molten processed region may be formed upon irradiation with laser light. Since the molten processed region is an example of the above-mentioned modified region, the semiconductor substrate can be cut easily, whereby the semiconductor substrate and die-bonding resin layer can efficiently be cut along the line to cut in this case as well.

When forming the cutting start region in the above-mentioned methods of cutting a semiconductor substrate in accordance with the present invention, a fracture may be caused to reach the front face of the semiconductor substrate from the cutting start region acting as a start point, a fracture may be caused to reach the rear face of the semiconductor substrate from the cutting start region acting as a start point, or a fracture may be caused to reach the front and rear faces of the semiconductor substrate from the cutting start region acting as a start point.

BRIEF DESCRIPTION OF THE DRAWINGS

FIGS. 11A and 11B are schematic views for explaining the method of cutting a silicon wafer in accordance with an embodiment, in which FIG. 11A shows a state where an adhesive sheet is bonded to the silicon wafer, whereas FIG. 11B shows a state where a part which is intended to be cut due to a molten processed region is formed within the silicon wafer;

FIGS. 12A and 12B are schematic views for explaining the method of cutting a silicon wafer in accordance with the embodiment, in which FIG. 12A shows a state where the adhesive sheet is expanded, whereas FIG. 12B shows a state where the adhesive sheet is irradiated with UV rays;

FIGS. 13A and 13B are schematic views for explaining the method of cutting a silicon wafer in accordance with the embodiment, in which FIG. 13A shows a state where a semiconductor chip is picked up together with a cut die-bonding resin layer, whereas FIG. 13B shows a state where the semiconductor chip is joined to a lead frame by way of the die-bonding resin layer;

FIGS. 14A and 14B are schematic views showing relationships between the silicon wafer and a part which is intended to be cut in the method of cutting a silicon wafer in accordance with the embodiment, in which FIG. 14A shows a state where no fractures are started from the part which is intended to be cut, whereas FIG. 14B shows a state where fractures started from the part which is intended to be cut have reached the front and rear faces of the silicon wafer;

FIGS. 15A and 15B are schematic views showing relationships between the silicon wafer and a part which is intended to be cut in the method of cutting a silicon wafer in accordance with the embodiment, in which FIG. 15A shows a state where a fracture started from the part which is intended to be cut has reached the front face of the silicon wafer, whereas FIG. 15B shows a state where a fracture started from the part which is intended to be cut has reached the rear face of the silicon wafer;

FIGS. 16A and 16B are schematic views for explaining an example of the method of cutting a silicon wafer in accordance with the embodiment, in which FIG. 16A shows a state immediately after starting expanding the adhesive sheet, whereas FIG. 16B shows a state during the expanding of the adhesive sheet;

FIGS. 17A and 17B are schematic views for explaining this example of the method of cutting a silicon wafer in accordance with the embodiment, in which FIG. 17A shows a state after completing the expanding of the adhesive sheet, whereas FIG. 17B shows a state at the time of picking up a semiconductor chip;

FIGS. 19A and 19B are views for explaining a case where no fractures are started from a part which is intended to be cut in still another example of the method of cutting a silicon wafer in accordance with the embodiment, in which FIG. 19A shows a state after the part which is intended to be cut due to a molten processed region is formed, whereas FIG. 19B shows a state where the adhesive sheet is expanded;

FIGS. 20A and 20B are views for explaining a case where fractures started from a part which is intended to be cut reach the front and rear faces of the silicon wafer in this example of the method of cutting a silicon wafer in accordance with the embodiment, in which FIG. 20A shows a state after the part which is intended to be cut due to a molten processed region is formed, whereas FIG. 20B shows a state where the adhesive sheet is expanded;

FIGS. 21A and 21B are views for explaining a case where a fracture started from a part which is intended to be cut reaches the front face of the silicon wafer in this example of the method of cutting a silicon wafer in accordance with the embodiment, in which FIG. 21A shows a state after the part which is intended to be cut due to a molten processed region is formed, whereas FIG. 21B shows a state where the adhesive sheet is expanded;

FIGS. 22A and 22B are views for explaining a case where a fracture started from a part which is intended to be cut reaches the rear face of the silicon wafer in this example of the method of cutting a silicon wafer in accordance with the embodiment, in which FIG. 22A shows a state after the part which is intended to be cut due to a molten processed region is formed, whereas FIG. 22B shows a state where the adhesive sheet is expanded;

FIGS. 24A to 24C are schematic views for explaining the method of cutting a semiconductor substrate in accordance with the embodiment, in which FIG. 24A shows a state where a protective film is bonded to the silicon wafer, FIG. 24B shows a state where the silicon wafer is thinned, and FIG. 24B shows a state where the protective film is irradiated with UV rays;

FIGS. 25A to 25C are schematic views for explaining the method of cutting a semiconductor substrate in accordance with the embodiment, in which FIG. 25A shows a state where the silicon wafer and protective film are fixed onto a mount table, FIG. 25B shows a state where the silicon wafer is irradiated with laser light, and FIG. 25C shows a state where a cutting start region is formed within the silicon wafer;

FIGS. 26A to 26C are schematic views for explaining the method of cutting a semiconductor substrate in accordance with the embodiment, in which FIG. 26A shows a state where a film with a die-bonding resin film is bonded to the silicon wafer, FIG. 26B shows a state where the protective film is peeled off from the silicon wafer, and FIG. 26C shows a state where an expandable film is irradiated with UV rays; and FIGS. 27A to 27C are schematic views for explaining the method of cutting a semiconductor substrate in accordance with the embodiment, in which FIG. 27A shows a state where the expandable film is expanded, FIG. 27B shows a state where a semiconductor chip is picked up together with a cut die-bonding resin layer, and FIG. 27C shows a state where the semiconductor chip is joined to a lead frame by way of the die-bonding resin layer.

BEST MODES FOR CARRYING OUT THE INVENTION

In the following, preferred embodiments of the method of cutting a semiconductor substrate in accordance with the present invention will be explained in detail with reference to drawings.

The method of cutting a semiconductor substrate in accordance with an embodiment irradiates a semiconductor substrate with laser light while locating a light-converging point within the semiconductor substrate, so as to form a modified region caused by multiphoton absorption within the semiconductor substrate, and causes the modified region to form a part which is intended to be cut. Therefore, before explaining the method of cutting a semiconductor substrate in accordance with this embodiment, a laser processing method carried out for forming the part which is intended to be cut will be explained mainly in terms of multiphoton absorption.

A material becomes optically transparent when its absorption bandgap $E_G$ is greater than photon energy hv. Hence, a condition under which absorption occurs in the material is $hv > E_G$. However, even when optically transparent, the material generates absorption under a condition of $nhv > E_G$ (where n=2, 3, 4, . . . ) if the intensity of laser light becomes very high. This phenomenon is known as multiphoton absorption. In the case of pulsed waves, the intensity of laser light is determined by the peak power density (W/cm$^2$) of laser light at a light-converging point. The multiphoton absorption occurs under a condition where the peak power density is $1 \times 10^8$ (W/cm$^2$) or greater, for example. The peak power density is determined by (energy of laser light at the light-converging point per pulse)/(beam spot cross-sectional area of laser light×pulse width). In the case of continuous waves, the intensity of laser light is determined by the field intensity (W/cm$^2$) of laser light at the light-converging point.

Figure 1:
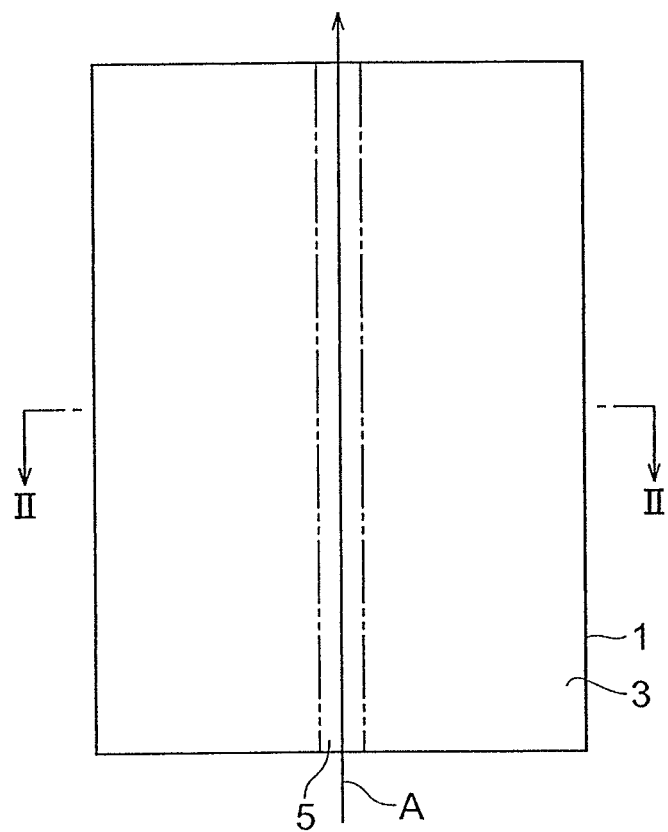
FIG. 1 is a plan view of a semiconductor substrate during laser processing by the laser processing method in accordance with an embodiment.
Figure 2:
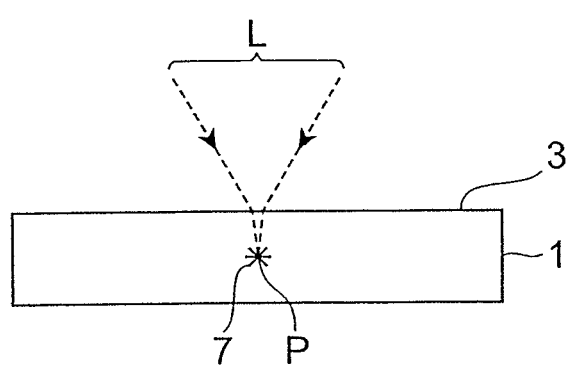
FIG. 2 is a sectional view of the semiconductor substrate taken along the line II-II of FIG. 1.
Figure 3:
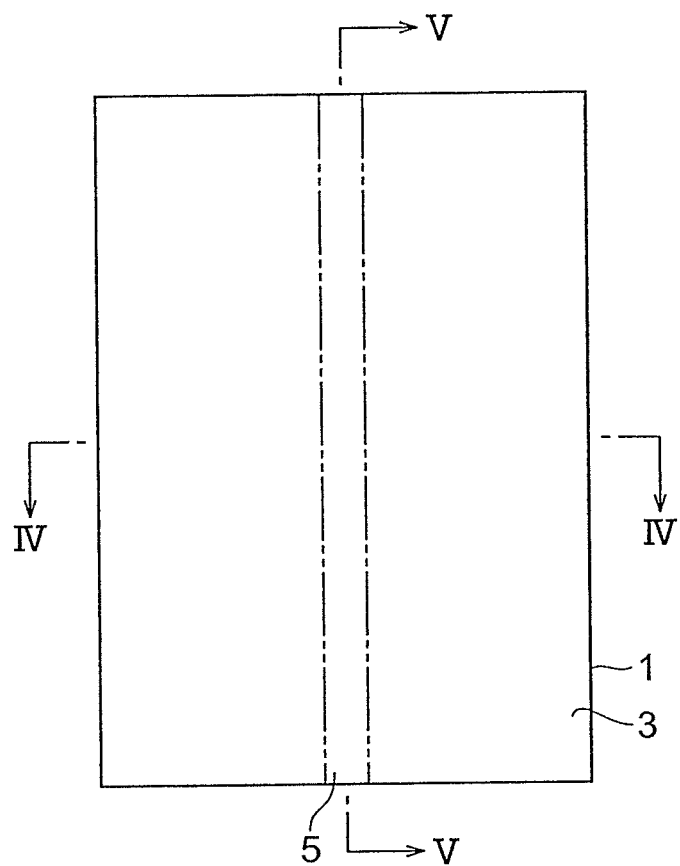
FIG. 3 is a plan view of the semiconductor substrate after laser processing by the laser processing method in accordance with the embodiment.
Figure 4:
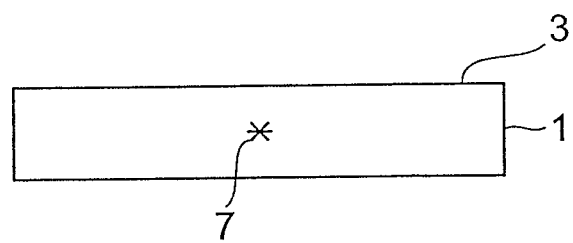
FIG. 4 is a sectional view of the semiconductor substrate taken along the line IV-IV of FIG. 3.
Figure 5:
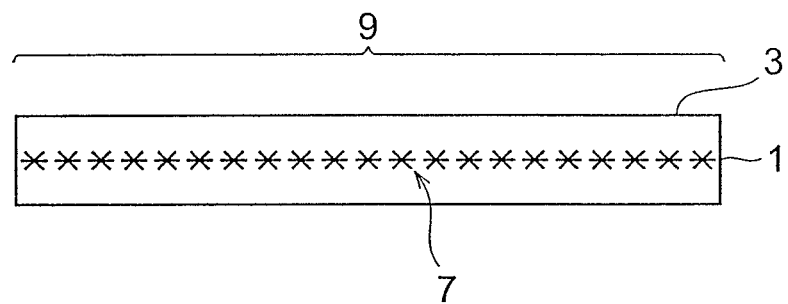
FIG. 5 is a sectional view of the semiconductor substrate taken along the line V-V of FIG. 3.
Figure 6:
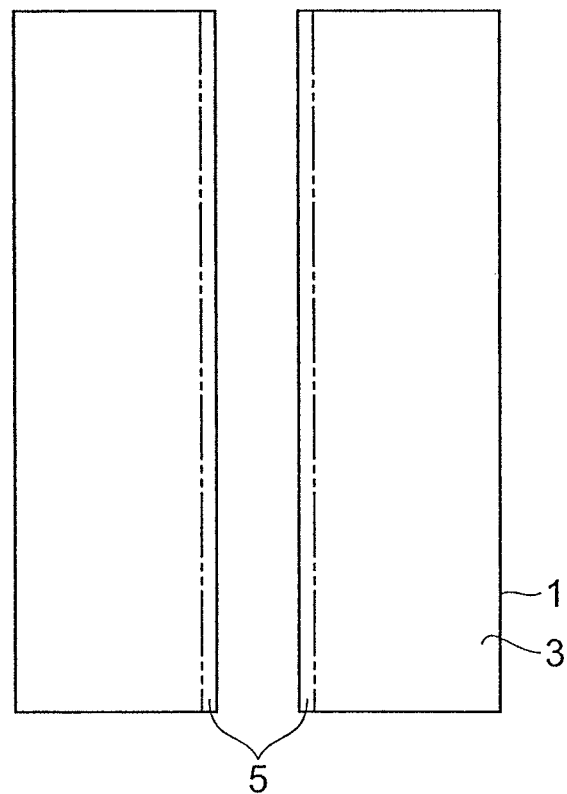
FIG. 6 is a plan view of the semiconductor substrate cut by the laser processing method in accordance with the embodiment.

The principle of the laser processing method in accordance with an embodiment using such multiphoton absorption will be explained with reference to FIGS. 1 to 6. FIG. 1 is a plan view of a semiconductor substrate 1 during laser processing. FIG. 2 is a sectional view of the semiconductor substrate 1 taken along the line II-II of FIG. 1. FIG. 3 is a plan view of the semiconductor substrate 1 after the laser processing. FIG. 4 is a sectional view of the semiconductor substrate 1 taken along the line IV-IV of FIG. 3. FIG. 5 is a sectional view of the semiconductor substrate 1 taken along the line V-V of FIG. 3. FIG. 6 is a plan view of the cut semiconductor substrate 1.

As shown in FIGS. 1 and 2, a desirable line to cut 5 exists on a front face 3 of the semiconductor substrate 1. The line to cut 5 is a virtual line extending straight (although a line may actually be drawn on the semiconductor substrate 1 so as to become the line to cut 5). The laser processing in accordance with this embodiment irradiates the semiconductor substrate 1 with laser light while locating a light-converging point P within the semiconductor substrate 1 under a condition generating multiphoton absorption, so as to form a modified region 7. The light-converging point is a position at which the laser light L is converged.

The laser light L is relatively moved along the line to cut 5 (i.e., along the direction of arrow A), so as to shift the light-converging point P along the line to cut 5. As a consequence, the modified region 7 is formed along the line to cut 5 only within the semiconductor substrate 1 as shown in FIGS. 3 to 5, and a part which is intended to be cut 9 is formed by the modified region 7. In the laser processing method in accordance with this embodiment, the modified region 7 is not formed by the heat generated from the semiconductor substrate 1 absorbing the laser light L. The laser light L is transmitted through the semiconductor substrate 1, so as to generate multiphoton absorption therewithin, thereby forming the modified region 7. Therefore, the front face 3 of the semiconductor substrate 1 hardly absorbs the laser light L and does not melt.

When a start point exists in an area for cutting the semiconductor substrate 1, the semiconductor substrate 1 fractures from this start point, whereby the semiconductor substrate 1 can be cut with a relatively small force as shown in FIG. 6. Hence, the semiconductor substrate 1 can be cut without generating unnecessary fractures in the front face 3 of the semiconductor substrate 1.

There seem to be the following two ways of cutting a semiconductor substrate from a cutting start region acting as a start point. The first case is where an artificial force is applied to the semiconductor substrate after the cutting start region is formed, so that the semiconductor substrate fractures from the cutting start region acting as a start point, and thus is cut. This is the cutting in the case where the semiconductor substrate has a large thickness, for example. Applying an artificial force refers to exerting a bending stress or shear stress to the semiconductor substrate along the cutting start region, or generating a thermal stress by imparting a temperature difference to the semiconductor substrate, for example. The other case is where the forming of the cutting start region causes the semiconductor substrate to fracture naturally in its cross-sectional direction (thickness direction) from the cutting start region acting as a start point, thereby cutting the semiconductor substrate. This becomes possible if the cutting start region is formed by one row of the modified region when the semiconductor substrate has a small thickness, or if the cutting start region is formed by a plurality of rows of the modified region in the thickness direction when the semiconductor substrate has a large thickness. Even in this naturally fracturing case, fractures do not extend onto the front face at a portion corresponding to an area not formed with the cutting start region in the part which is intended to be cut, so that only the portion corresponding to the area formed with the cutting start region can be cleaved, whereby cleavage can be controlled well. Such a cleaving method with a favorable controllability is quite effective, since semiconductor substrates such as silicon wafers have recently been apt to decrease their thickness.

An example of the modified region formed by multiphoton absorption in this embodiment is a molten processed region which will be explained in the following.

A semiconductor substrate is irradiated with laser light while locating a light-converging point therewithin under a condition with a field intensity of at least $1 \times 10^8$ (W/cm$^2$) at the light-converging point and a pulse width of 1 µs or less. As a consequence, the inside of the object is locally heated by multiphoton absorption. This heating forms a molten processed region within the object. The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example. The upper limit of field intensity is $1 \times 10^{12}$ (W/cm$^2$), for example. The pulse width is preferably 1 to 200 ns, for example.

By an experiment, the inventors verified that a molten processed region was formed within a silicon wafer. The following are conditions of the experiment.

(A) Object to be processed: silicon wafer (with a thickness of 350 µm and an outer diameter of 4 inches)

(B) Laser light source: semiconductor laser pumping Nd:YAG laser
wavelength: 1064 nm
laser light spot cross-sectional area: $3.14 \times 10^{-8}$ cm$^2$
oscillation mode: Q-switched pulse
repetition frequency: 100 kHz
pulse width: 30 ns
output: 20 µJ/pulse
laser light quality: TEM$_{00}$
polarizing property: linear polarization (C) Condenser lens
magnification: ×50
NA: 0.55
transmittance at a laser light wavelength: 60%

(D) Moving rate of the mount table mounting the object 100 mm/sec

Figure 7:
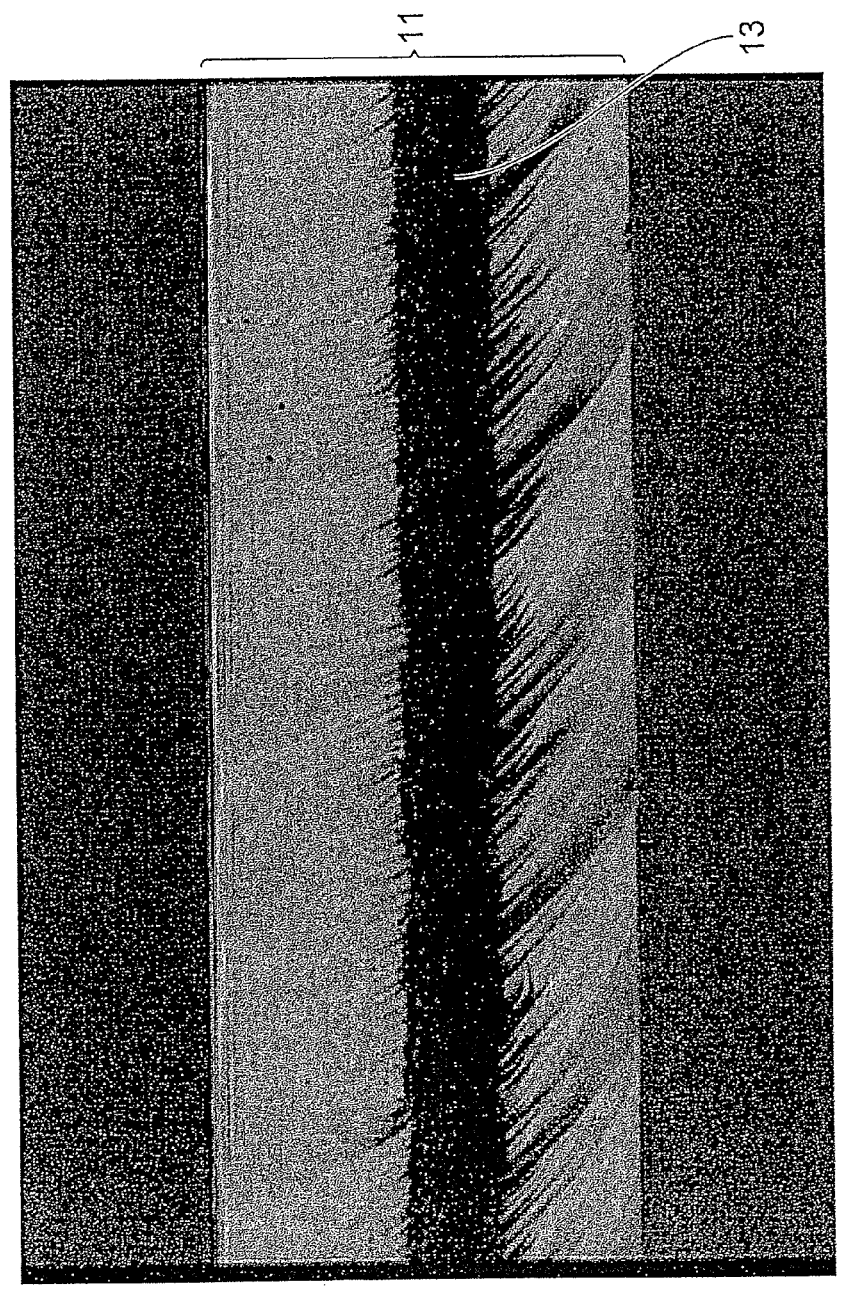
FIG. 7 is a view showing a photograph of a cross section in a part of a silicon wafer cut by the laser processing method in accordance with the embodiment.

FIG. 7 is a view showing a photograph of a cross section of a part of a silicon wafer cut by laser processing under the conditions mentioned above. A molten processed region 13 is formed within the silicon wafer 11. The molten processed region 13 formed under the above-mentioned conditions has a size of about 100 µm in the thickness direction.

Figure 8:
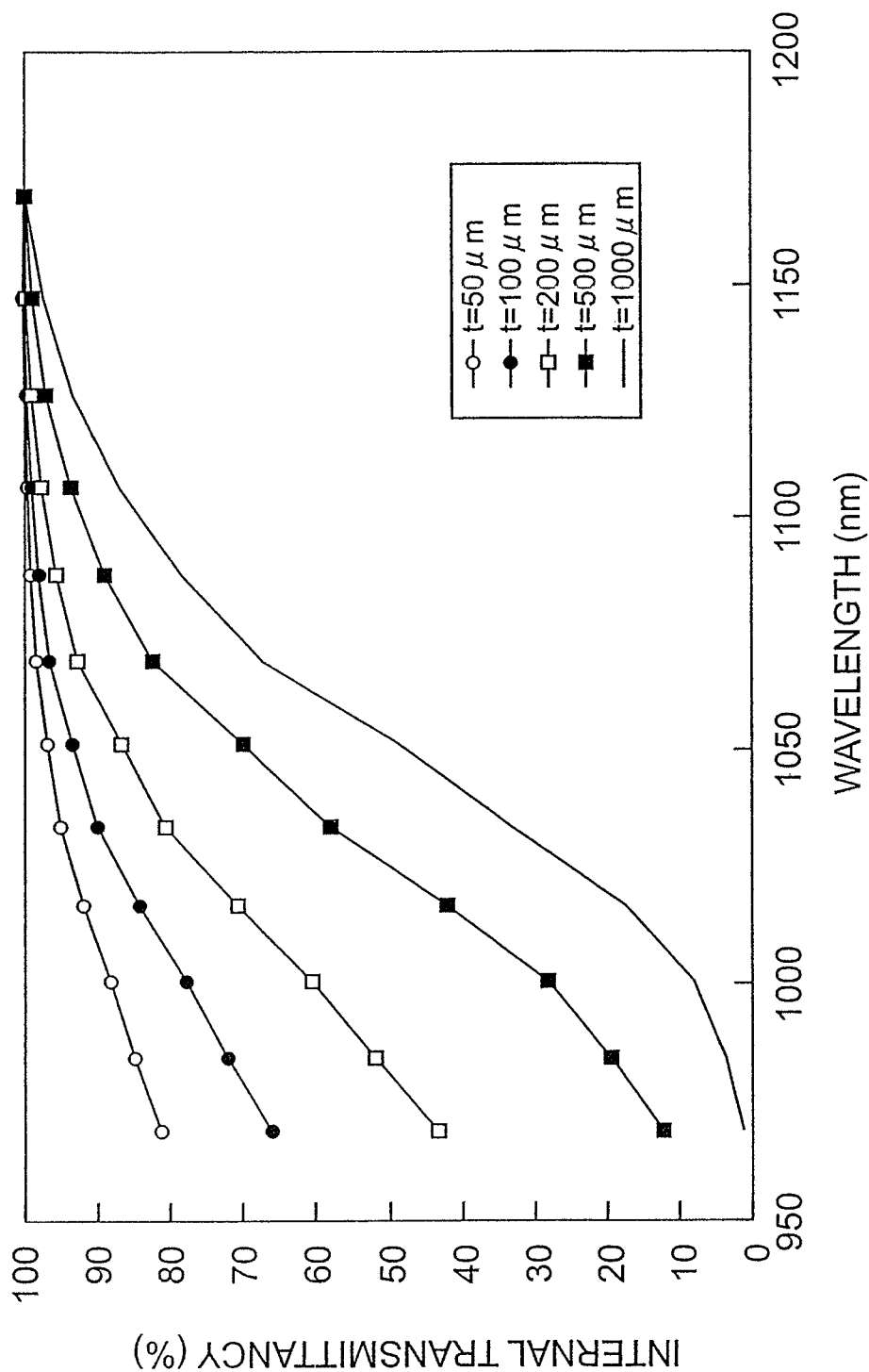
FIG. 8 is a graph showing relationships between the laser light wavelength and the transmittance within a silicon substrate in the laser processing method in accordance with the embodiment.

The fact that the molten processed region 13 is formed by multiphoton absorption will now be explained. FIG. 8 is a graph showing relationships between the laser light wavelength and the transmittance within the silicon substrate. Here, the respective reflected components on the front and rear sides of the silicon substrate are eliminated, so as to show the internal transmittance alone. The respective relationships are shown in the cases where the thickness t of the silicon substrate is 50 µm, 100 µm, 200 µm, 500 µm, and 1000 µm.

For example, at the Nd:YAG laser wavelength of 1064 nm, the laser light appears to be transmitted through the silicon substrate by at least 80% when the silicon substrate has a thickness of 500 µm or less. Since the silicon wafer 11 shown in FIG. 7 has a thickness of 350 µm, the molten processed region 13 caused by multiphoton absorption is formed near the center of the silicon wafer 11, i.e., at a part distanced from the front face by 175 µm. The transmittance in this case is 90% or more with reference to a silicon wafer having a thickness of 200 µm, whereby the laser light is absorbed only slightly within the silicon wafer 11 but is substantially transmitted therethrough. This means that the molten processed region 13 is formed within the silicon wafer 11 not by laser light absorption within the silicon wafer 11 (i.e., not by usual heating with the laser light) but by multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

A fracture is generated in a silicon wafer from a cutting start region formed by a molten processed region, acting as a start point, toward a cross section, and reaches the front and rear faces of the silicon wafer, whereby the silicon wafer is cut. The fracture reaching the front and rear faces of the silicon wafer may grow naturally or as a force is applied to the silicon wafer. The fracture naturally growing from the cutting start region to the front and rear faces of the silicon wafer encompasses a case where the fracture grows from a state where the molten processed region forming the cutting start region is molten and a case where the fracture grows when the molten processed region forming the cutting start region is re-solidified from the molten state. In either case, the molten processed region is formed only within the silicon wafer, and thus is present only within the cut section after cutting as shown in FIG. 7. When a cutting start region is formed within the object by a molten processed region as such, unnecessary fractures deviating from a cutting start region line are harder to occur at the time of cleaving, whereby cleavage control becomes easier.

When a cutting start region is formed as follows while taking account of the crystal structure of a semiconductor substrate, its cleavage characteristic, and the like, the object can be cut with a high precision by a smaller force from the cutting start region acting as a start point.

Namely, in the case of a substrate made of a monocrystal semiconductor having a diamond structure such as silicon, it will be preferred if a cutting start region is formed in a direction extending along a (111) plane (first cleavage plane) or a (110) plane (second cleavage plane). In the case of a substrate made of a III-V family compound semiconductor of sphalerite structure such as GaAs, it will be preferred if a cutting start region is formed in a direction extending along a (110) plane.

When the substrate is formed with an orientation flat in a direction to be formed with the above-mentioned cutting start region (e.g., a direction extending along a (111) plane in a monocrystal silicon substrate) or a direction orthogonal to the direction to be formed therewith, the cutting start region extending in the direction to be formed with the cutting start region can be formed easily and accurately with reference to the orientation flat.

Figure 9:
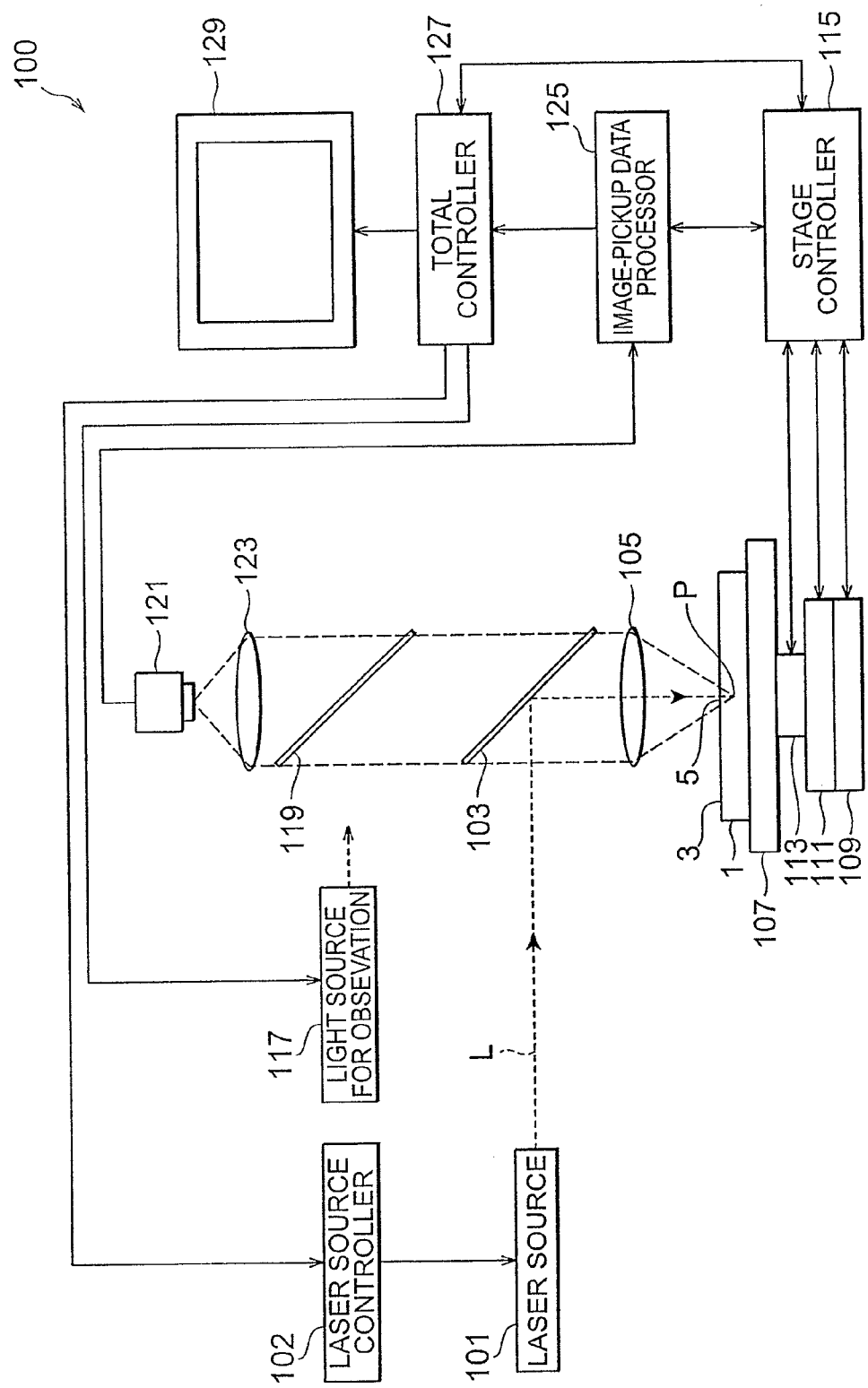
FIG. 9 is a schematic diagram of the laser processing apparatus in accordance with an embodiment.

With reference to FIG. 9, a laser processing apparatus used in the above-mentioned laser processing method will now be explained. FIG. 9 is a schematic diagram of a laser processing apparatus 100.

The laser processing apparatus 100 comprises a laser light source 101 for generating laser light L; a laser light source controller 102 for controlling the laser light source 101 in order to regulate the output, pulse width, and the like of the laser light L; a dichroic mirror 103 arranged so as to change the orientation of the optical axis of the laser light L by 90° while functioning to reflect the laser light L; a condenser lens 105 for converging the laser light L reflected by the dichroic mirror 103; a mount table 107 for mounting a semiconductor substrate 1 to be irradiated with the laser light L converged by the condenser lens 105; an X-axis stage 109 for moving the mount table 107 along an X axis; a Y-axis stage 111 for moving the mount table 107 along a Y axis which is orthogonal to the X axis; a Z-axis stage 113 for moving the mount table 107 along a Z-axis which is orthogonal to X and Y axes; and a stage controller 115 for controlling the movement of the three stages 109, 111, 113.

The Z axis is orthogonal to the front face 3 of the semiconductor substrate 1, and thus is the direction of focal depth of the laser light incident on the semiconductor substrate 1. Therefore, the light-converging point P of the laser light L can be positioned within the semiconductor substrate 1 by moving the Z-axis stage 113 along the Z axis. The movement of the light-converging point P along the X (Y) axis is performed by moving the semiconductor substrate 1 along the X (Y) axis by the X (Y)-axis stage 109 (111).

The laser light source 101 is Nd:YAG laser generating pulsed laser light. Other examples of the laser employable in the laser light source 101 include Nd:YVO$_4$ laser, Nd:YLF laser, and titanium sapphire laser. For forming a molten processed region, Nd:YAG laser, Nd:YVO$_4$ laser, and Nd:YLF laser are preferably used. Though this embodiment uses pulsed laser light for processing the semiconductor substrate 1, continuous wave laser light may also be used if it can cause multiphoton absorption.

The laser processing apparatus 100 further comprises an observation light source 117 for generating visible rays for illuminating the semiconductor substrate 1 mounted on the mount table 107, and a visible ray beam splitter 119 disposed on the same optical axis as with the dichroic mirror 103 and condenser lens 105. The dichroic mirror 103 is disposed between the beam splitter 119 and condenser lens 105. The beam splitter 119 functions to reflect about a half of the visible rays and transmit the remaining half therethrough, and is disposed so as to change the orientation of the optical axis of visible rays by 90°. About a half of the visible rays generated from the observation light source 117 are reflected by the beam splitter 119. Thus reflected visible rays pass through the dichroic mirror 103 and condenser lens 105, thereby illuminating the front face 3 of the semiconductor substrate 1 including the line to cut 5 and the like.

The laser processing apparatus 100 further comprises an image pickup device 121 and an imaging lens 123 which are disposed on the same optical axis as with the beam splitter 119, dichroic mirror 103, and condenser lens 105. An example of the image pickup device 121 is a CCD camera. The reflected light of visible rays having illuminated the front face 3 of the semiconductor substrate 1 including the line to cut 5 and the like passes through the condenser lens 105, dichroic mirror 103, and beam splitter 119, so as to be focused by the imaging lens 123 and captured by the image pickup device 121, thus yielding imaging data.

The laser processing apparatus 100 further comprises an imaging data processor 125 for inputting the imaging data outputted from the image pickup device 121, an overall controller 127 for controlling the laser processing apparatus 100 as a whole, and a monitor 129. Based on the imaging data, the imaging data processor 125 calculates focal data for positioning the focal point of visible rays generated by the observation light source 117 onto the front face 3. According to the focal data, the stage controller 115 regulates the movement of the Z-axis stage 113, so as to position the focal point of visible rays at the front face 3. Thus, the imaging data processor 125 functions as an autofocus unit. On the basis of imaging data, the imaging data processor 125 calculates image data such as enlarged images of the front face 3. The image data are sent to the overall controller 127, so as to be subjected to various processing operations, and thus processed data are transmitted to the monitor 129. As a consequence, enlarged images and the like are displayed on the monitor 129.

The data from the stage controller 115, the image data from the imaging data processor 125, etc. are fed into the overall controller 127, whereas the laser light source controller 102, observation light source 117, and stage controller 115 are regulated according to these data as well, whereby the laser processing apparatus 100 as a whole is controlled. Hence, the overall controller 127 functions as a computer unit.

Figure 10:
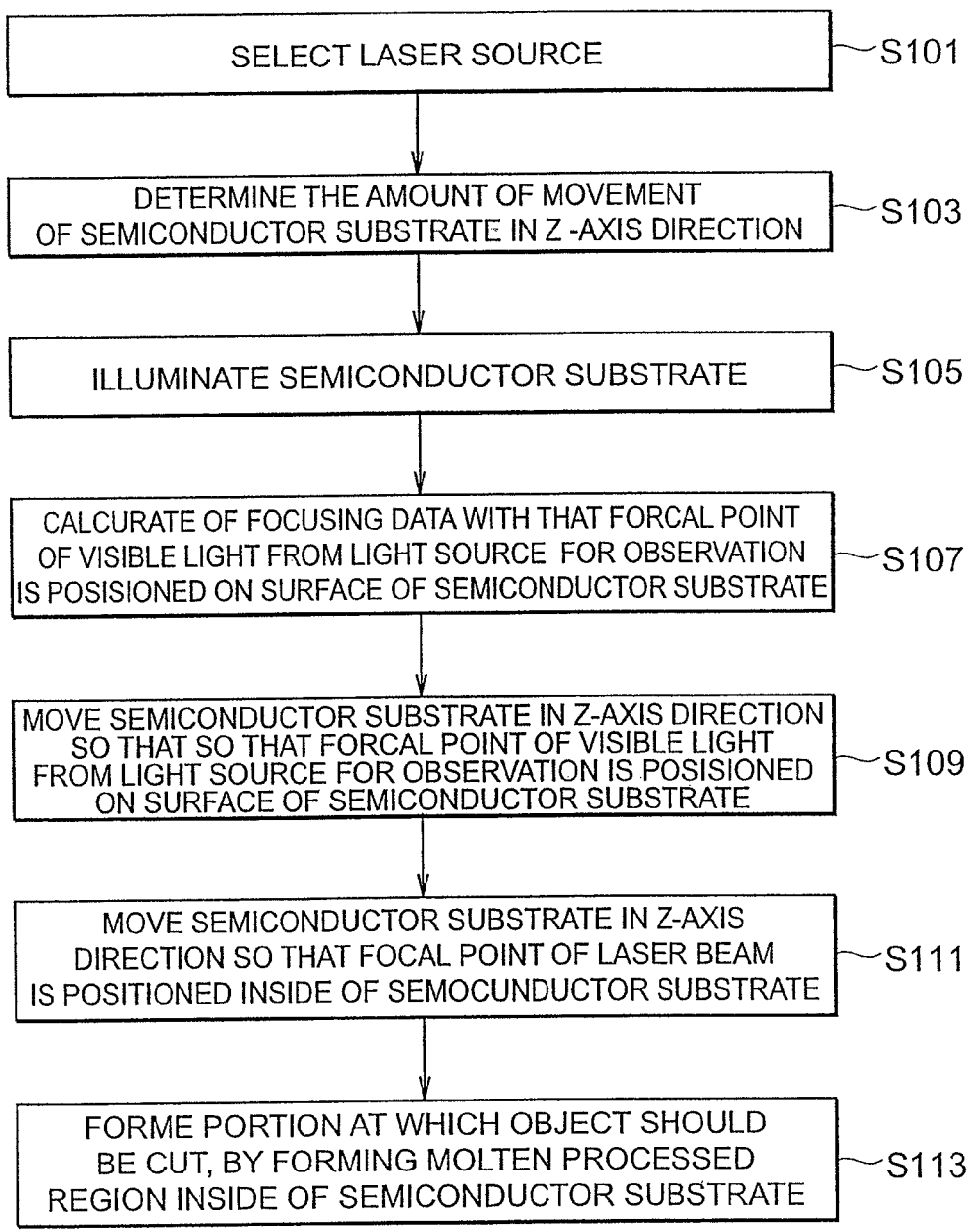
FIG. 10 is a flowchart for explaining a procedure of forming a part which is intended to be cut by the laser processing apparatus in accordance with the embodiment.

A procedure by which thus configured laser processing apparatus 100 forms a part which is intended to be cut will now be explained with reference to FIGS. 9 and 10. FIG. 10 is a flowchart for explaining the procedure by which thus configured laser processing apparatus 100 for a part which is intended to be cut.

The light absorption characteristic of the semiconductor substrate 1 is measured by a spectrophotometer or the like which is not depicted. According to the result of measurement, a laser light source 101 generating laser light L having a wavelength to which the semiconductor substrate 1 is transparent or less absorptive is chosen (S101). Subsequently, the thickness of the semiconductor substrate 1 is measured. According to the result of measurement of thickness and the refractive index of the semiconductor substrate 1, the amount of movement of the semiconductor substrate along the Z axis is determined (S103). This is an amount of movement the semiconductor substrate 1 along the Z axis with reference to the light-converging point P of laser light positioned at the front face 3 of the semiconductor substrate 1 for locating the light-converging point P of laser light L within the semiconductor substrate 1. This amount of movement is fed into the overall controller 127.

The semiconductor substrate 1 is mounted on the mount table 107 of the laser processing apparatus 100. Then, visible rays are generated from the observation light source 117, so as to illuminate the semiconductor substrate 1 (S105). The front face 3 of the semiconductor substrate 1 including the illuminated line to cut 5 is captured by the image pickup device 121. The line to cut 5 is a desirable virtual line to cut the semiconductor substrate 1. The imaging data captured by the image pickup device 121 is sent to the imaging data processor 125. According to the imaging data, the imaging data processor 125 calculates such focal data as to position the focal point of visible rays generated by the observation light source 117 onto the front face 3 (S107).

The focal data is sent to the stage controller 115. According to the focal data, the stage controller 115 moves the Z-axis stage 113 along the Z axis (S109). As a consequence, the focal point of the visible rays from the observation light source 117 is positioned at the front face 3 of the semiconductor substrate 1. According to the imaging data, the imaging data processor 125 calculates enlarged image data of the front face 3 of the semiconductor substrate 1 including the line to cut 5. The enlarged image data is sent to the monitor 129 by way of the total controller 127, whereby an enlarged image of the line to cut 5 and its vicinity is displayed on the monitor 129.

The movement amount data determined by step S103 has been fed into the total controller 127 beforehand, and is sent to the stage controller 115. According to the movement amount data, the stage controller 115 causes the Z-axis stage 113 to move the semiconductor substrate 1 along the Z axis to such a position that the light-converging point P of laser light L is located within the semiconductor substrate 1 (S111).

Subsequently, laser light L is generated from the laser light source 101, so as to illuminate the line to cut 5 in the front face 3 of the semiconductor substrate 1. Since the light-converging point P of laser light L is located within the semiconductor substrate 1, a molten processed region is formed only within the semiconductor substrate 1. Then, the X-axis stage 109 and Y-axis stage 111 are moved along the line to cut 5, whereby the molten processed region formed along the line to cut 5 forms a part which is intended to be cut along the line to cut 5 (S113).

The foregoing completes the forming of the part which is intended to be cut by the laser processing apparatus 100, whereby the part which is intended to be cut is formed within the semiconductor substrate 1. When the part which is intended to be cut is formed within the semiconductor substrate 1, a relatively small force can start fractures in the thickness direction of the semiconductor substrate 1 from the part which is intended to be cut.

The method of cutting a semiconductor substrate in accordance with this embodiment will now be explained. Here, a silicon wafer 11 which is a semiconductor wafer is used as the semiconductor substrate.

Figure 11A:
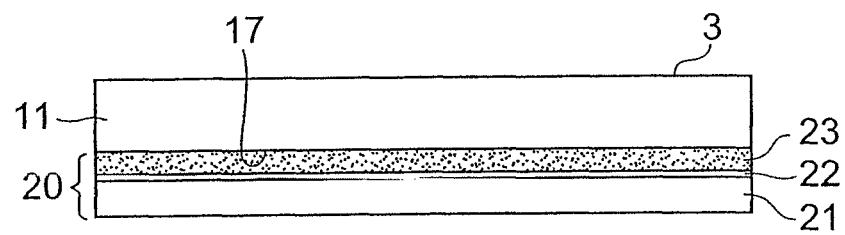

First, as shown in FIG. 11A, an adhesive sheet 20 is bonded to the rear face 17 of the silicon wafer 11 so as to cover the rear face 17. The adhesive sheet 20 includes a base 21 having a thickness of about 100 µm, on which a UV-curable resin layer 22 having a thickness on the order of several micrometers is disposed. Further, on the UV-curable resin layer 22, a die-bonding resin layer 23 functioning as a die-bonding adhesive is disposed. A plurality of functional devices are formed like a matrix on the front face 3 of the silicon wafer 11. The functional device refers to a light-receiving device such as photodiode, a light-emitting device such as laser diode, a circuit device formed as a circuit, or the like.

Figure 11B:
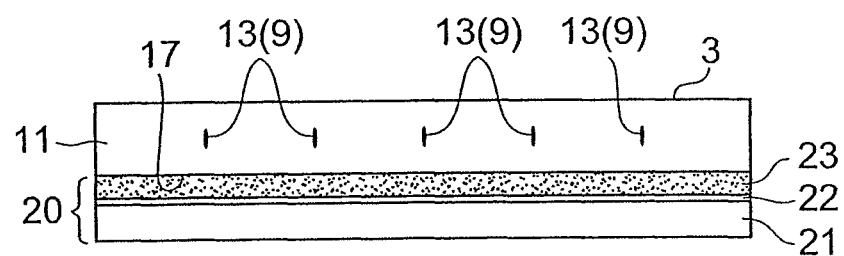

Subsequently, as shown in FIG. 11B, the silicon wafer 11 is irradiated with laser light from the front face 3 side by using the above-mentioned laser processing apparatus 100, for example, such that the light-converging point is located within the silicon wafer 11. As a consequence, a molten processed region 13, which is a modified region, is formed within the silicon wafer 11, whereby a part which is intended to be cut 9 is formed. In the forming of the part which is intended to be cut 9, the laser light is emitted so as to run between a plurality of functional devices arranged like a matrix on the front face 3 of the silicon wafer 11, whereby the part which is intended to be cut 9 is formed like a grid running directly under between neighboring functional devices.

Figure 12A:
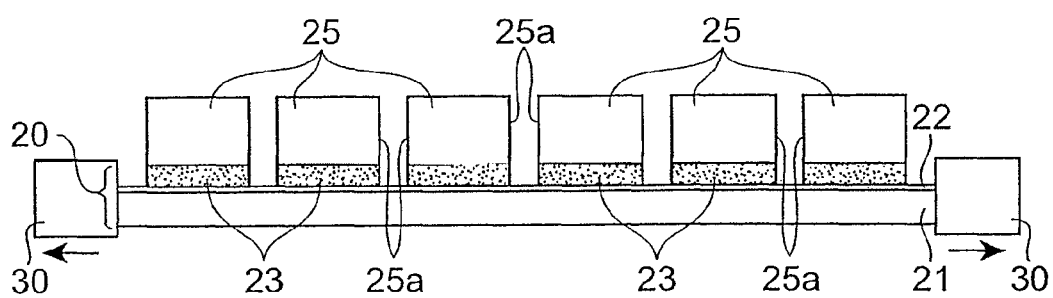

After forming the part which is intended to be cut 9, sheet expanding means 30 pulls the periphery of the adhesive sheet 20 outward as shown in FIG. 12A, thereby expanding the adhesive sheet 20. Expanding the adhesive sheet 20 starts fractures in the thickness direction from the part which is intended to be cut 9, and the fractures reach the front face 3 and rear face 17 of the silicon wafer 11. As a consequence, the silicon wafer 11 is cut into the functional devices with a high precision, whereby semiconductor chips 25 each having one functional device are obtained.

Here, opposing cut sections 25a, 25a of neighboring semiconductor chips 25, 25 are initially in close contact with each other, but are separated from each other as the adhesive sheet 20 expands, whereby the die-bonding resin layer 23 in close contact with the rear face 17 of the silicon wafer 11 is cut along the part which is intended to be cut 9.

There are cases where the sheet expanding means 30 is disposed on a stage for mounting the silicon wafer 11 when forming the line to cut 9, and not. In the case where the sheet expanding means 30 is not disposed on the stage, transfer means transfers the silicon wafer 11 mounted on the stage onto another stage provided with the sheet expanding means 30 after forming the part which is intended to be cut 9.

Figure 12B:
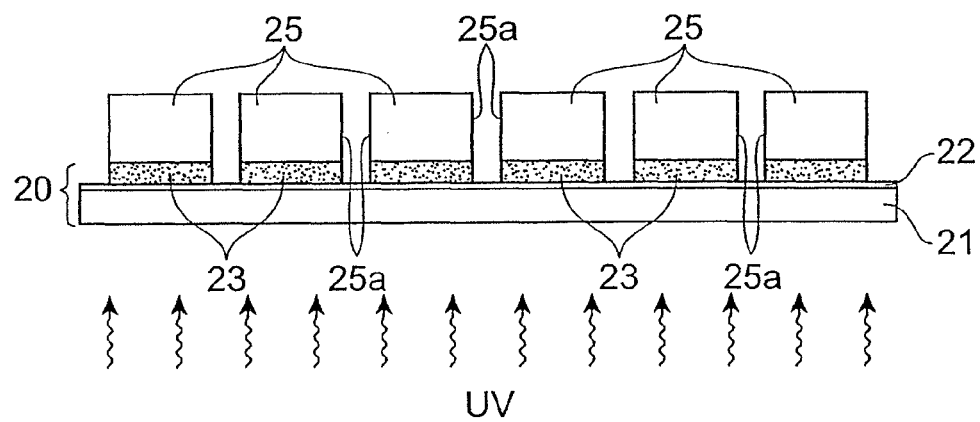

After the expanding of the adhesive sheet 20 is completed, the adhesive sheet 20 is irradiated with UV rays from the rear face side as shown in FIG. 12B, whereby the UV-curable resin layer 22 is cured. This lowers the adhesive force between the UV-curable resin layer 22 and die-bonding resin layer 23. The irradiation with the UV rays may be performed before the expanding of the adhesive sheet 20 begins as well.

Figure 13A:
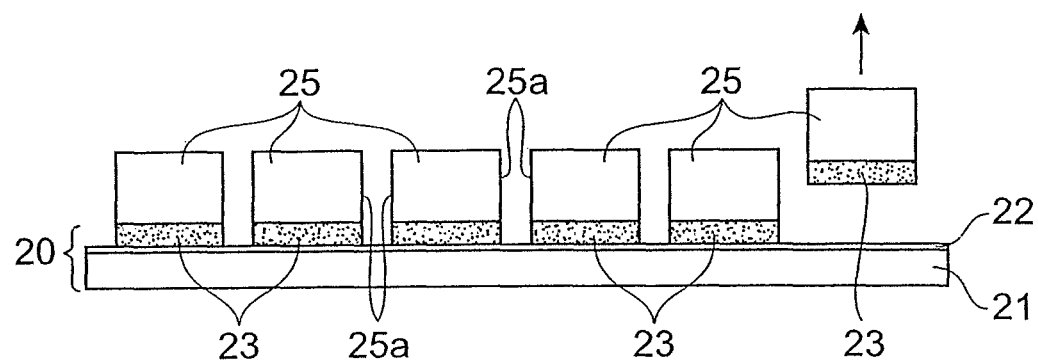
Figure 13B:
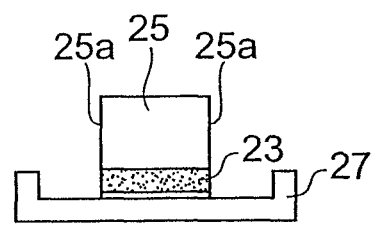

Subsequently, as shown in FIG. 13A, a vacuum collet or the like, which is pickup means, is used for successively picking up the semiconductor chips 25. Here, the die-bonding resin layer 23 is cut into outer forms similar to those of the semiconductor chips 25, whereas the adhesive force between the die-bonding resin layer 23 and UV-curable resin layer 22 is lowered, whereby each semiconductor chip 25 is picked up while in a state where the cut die-bonding resin layer 23 is attached to its rear face. Then, as shown in FIG. 13B, the semiconductor chip 25 is mounted on a die pad of a lead frame 27 by way of the die-bonding resin layer 23 closely in contact with the rear face, and is joined thereto with the filler upon heating.

In the method of cutting the silicon wafer 11, the molten processed region 13 formed by multiphoton absorption yields the line to cut 9 within the silicon wafer 11 along a desirable line to cut for cutting the silicon wafer 11 as in the foregoing. Therefore, when the adhesive sheet 20 bonded to the silicon wafer 11 is expanded, the silicon wafer 11 is cut along the part which is intended to be cut 9 with a high precision, whereby the semiconductor chips 25 are obtained. Here, the opposing cut sections 25a, 25a of the neighboring semiconductor substrates 25, 25 are initially in close contact with each other, but are separated from each other as the adhesive sheet 20 expands, whereby the die-bonding resin layer 23 in close contact with the rear face 17 of the silicon wafer 11 is cut along the part which is intended to be cut 9. Therefore, the silicon wafer 11 and die-bonding resin layer 23 can be cut along the part which is intended to be cut 9 much more efficiently than in the case where the silicon wafer 11 and die-bonding resin layer 23 are cut with a blade without cutting the base 21.

Also, since the opposing cut sections 25a, 25a of the neighboring semiconductor chips 25, 25 are initially in close contact with each other, the cut individual semiconductor chips 25 and cut pieces of the die-bonding resin layer 23 have substantially the same outer form, whereby the die-bonding resin is prevented from protruding from the cut sections 25a of the semiconductor chips 25.

Figure 14A:
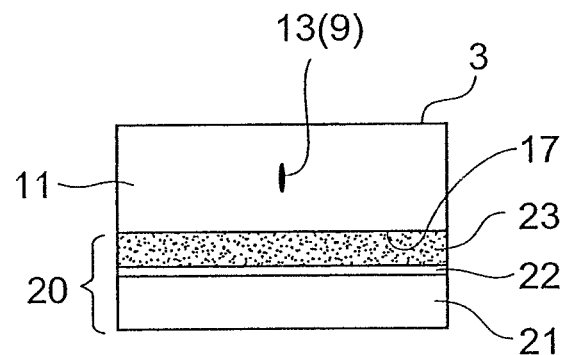
Figure 14B:
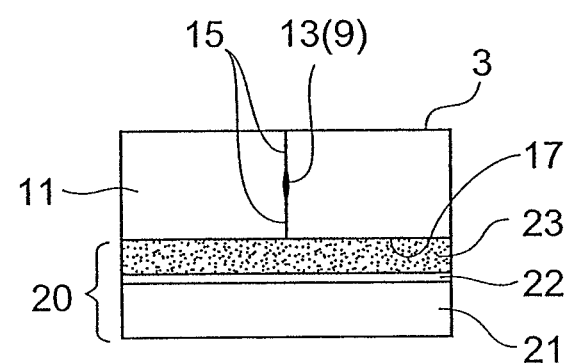

Though the foregoing method of cutting the silicon wafer 11 relates to a case where fractures starting from the part which is intended to be cut 9 are not generated in the silicon wafer 11 before the adhesive sheet 20 is expanded as shown in FIG. 14A, fractures 15 may be started from the part which is intended to be cut 9 so as to reach the front face 3 and rear face 17 of the silicon wafer 11 as shown in FIG. 14B before expanding the adhesive sheet 20. Examples of methods of generating the fractures 15 include one in which stress applying means such as a knife edge is pressed against the rear face 17 of the silicon wafer 11 along the part which is intended to be cut 9 so as to cause a bending stress or shear stress in the silicon wafer 11 along the part which is intended to be cut 9, and one in which a temperature difference is given to the silicon wafer 11 so as to generate a thermal stress in the silicon wafer 11 along the part which is intended to be cut 9.

When a stress is generated in the silicon wafer 11 along the part which is intended to be cut 9 after forming the part which is intended to be cut 9, so as to cut the silicon wafer 11 along the part which is intended to be cut 9 as such, semiconductor chips 25 cut with a very high precision can be obtained. When the adhesive sheet 20 bonded to the silicon wafer 11 is expanded, the opposing cut sections 25a, 25a of the neighboring semiconductor substrates 25, are separated from each other from their close contact state as the adhesive sheet 20 expands, whereby the die-bonding resin layer 23 in close contact with the rear face 17 of the silicon wafer 11 is cut along the cut sections 25a in this case as well. Therefore, the silicon wafer 11 and die-bonding resin layer 23 can also be cut along the part which is intended to be cut 9 much more efficiently by this cutting method than in the case where the silicon wafer 11 and die-bonding resin layer 23 are cut with a blade without cutting the base 21.

Figure 15A:
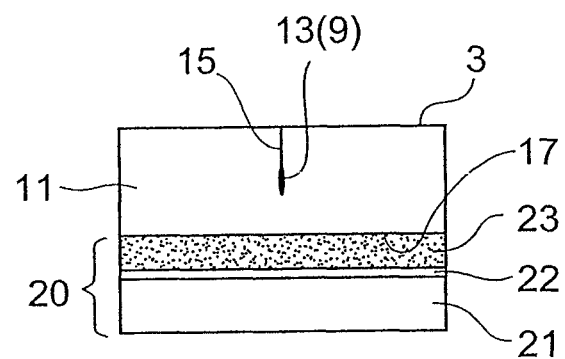
Figure 15B:
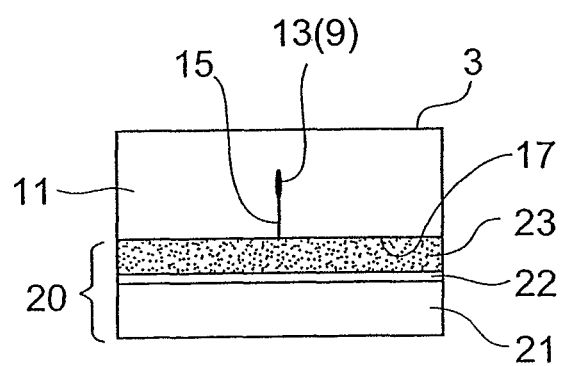

When the silicon wafer 11 becomes thinner, there is a case where fractures 15 started from the part which is intended to be cut 9 reach the front face 3 and rear face 17 of the silicon wafer 11 as shown in FIG. 14B without causing a stress along the part which is intended to be cut 9. When the part which is intended to be cut 9 caused by the molten processed region 13 is formed near the front face 3 within the silicon wafer 11 such that a fracture 15 reaches the front face 3 as shown in FIG. 15A, the cutting accuracy of the front face (i.e., functional device forming surface) of the semiconductor chips 25 obtained by cutting can be made very high. When the part which is intended to be cut 9 caused by the molten processed region 13 is formed near the rear face 17 within the silicon wafer 11 such that a fracture 15 reaches the rear face 17 as shown in FIG. 15B, on the other hand, the die-bonding resin layer 23 can be cut with a high precision by expanding the adhesive sheet 20.

Results of an experiment in a case using "LE-5000 (product name)" available from Lintec Corporation as the adhesive sheet 20 will now be explained. FIGS. 16 and 17 are schematic views showing a series of states in the case where the adhesive sheet 20 is expanded after the part which is intended to be cut 9 caused by the molten processed region 13 is formed within the silicon wafer 11. Namely, FIG. 16A shows the state immediately after starting expanding the adhesive sheet 20, FIG. 16B shows the state in the process of expanding, FIG. 17A shows the state after the expanding of the adhesive sheet 20 is completed, and FIG. 17B shows the state at the time of picking up the semiconductor chip 25.

Figure 16A:
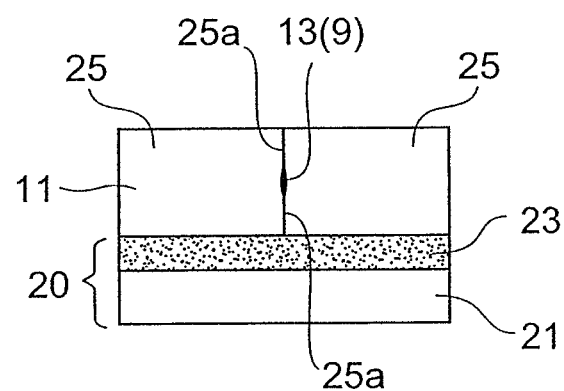
Figure 16B:
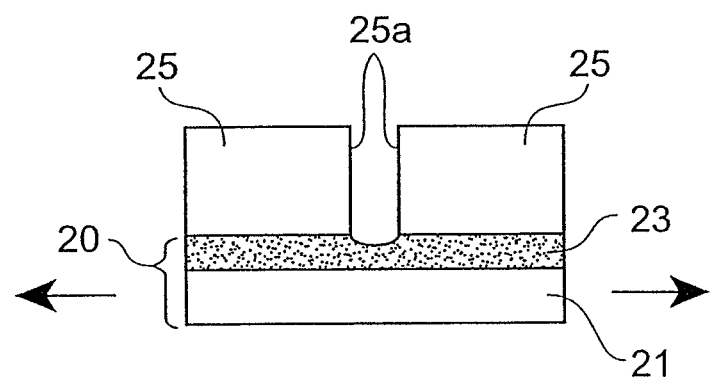

Immediately after starting expanding the adhesive sheet 20, the silicon wafer 11 was cut along the part which is intended to be cut 9, whereby the opposing cut sections 25a, 25a of neighboring semiconductor chips 25 were in close contact with each other as shown in FIG. 16A. Here, the die-bonding resin layer 23 had not been cut yet. Then, as the adhesive sheet 20 expanded, the die-bonding resin layer 23 was torn apart so as to be cut along the part which is intended to be cut 9 as shown in FIG. 16B.

Figure 17A:
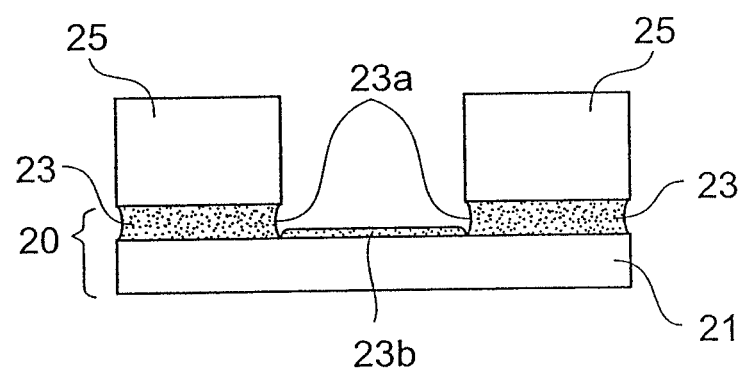
Figure 17B:
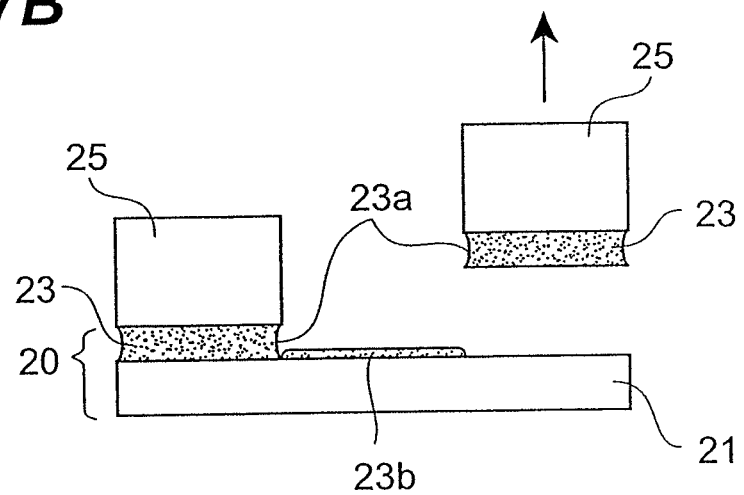

When the expanding of the adhesive sheet 20 was completed as such, the die-bonding resin layer 23 was cut into the individual semiconductor chips 25 as shown in FIG. 17A. Here, a part 23b of the die-bonding resin layer 23 was left thinly on the base 21 of the adhesive sheet 20 between the semiconductor chips 25, 25 separated from each other. The cut section 23a of the die-bonding resin layer 23 cut together with the semiconductor chip 25 was slightly recessed with reference to the cut section 25a of the semiconductor chip 25. This reliably prevented the die-bonding resin from protruding from the cut sections 25a of the semiconductor chips 25. Then, the semiconductor chip 25 could be picked up together with the cut die-bonding resin layer 23 by a vacuum collet or the like as shown in FIG. 17B.

Figure 18:
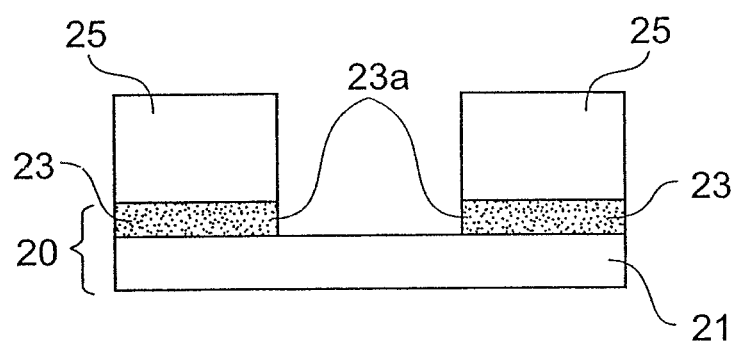
FIG. 18 is a schematic view for explaining another example of the method of cutting a silicon wafer in accordance with the embodiment.

When made of a nonelastic material and the like, the die-bonding resin layer 23 is not left on the base 21 of the adhesive sheet 20 between the semiconductor chips 25, 25 separated from each other as shown in FIG. 18. Consequently, the cut section 25a of the semiconductor chip 25 and the cut section 23a of the die-bonding resin layer 23 in close contact with the rear face thereof can substantially coincide with each other.

Figure 19A:
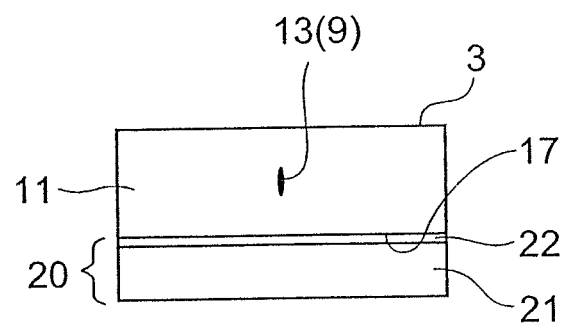
Figure 19B:
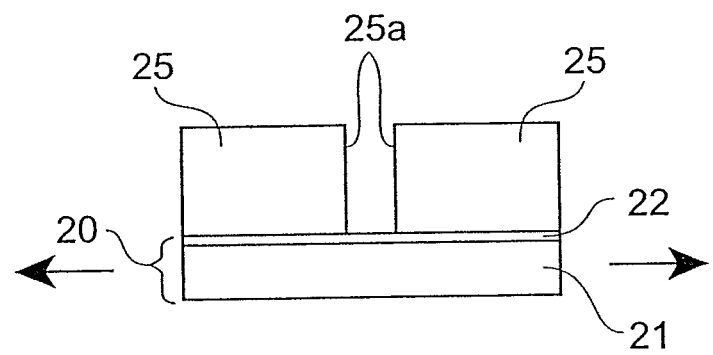

The adhesive sheet 20 comprising the base 21 and UV-curable resin layer 22 may be bonded to the rear face 17 of the silicon wafer 11 by way of the UV-curable resin layer 22 as shown in FIG. 19A, so as to than the part which is intended to be cut 9 caused by the molten processed region 13, and then the periphery of the adhesive sheet 20 may be extended outward as shown in FIG. 19B, so as to cut the silicon wafer 11 into the semiconductor chips 25. The silicon wafer 11 can also be cut along the part which is intended to be cut 9 with a high precision much more efficiently in this case than in the case where the silicon wafer 11 is cut with a blade while leaving the adhesive sheet 20.

Figure 20A:
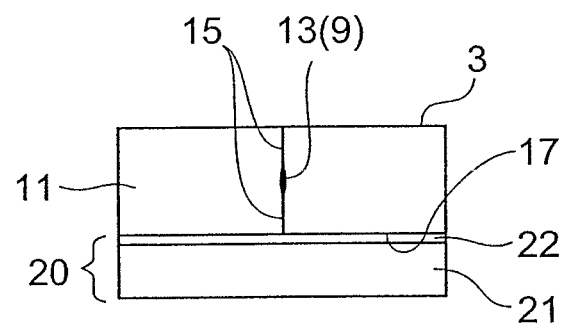
Figure 20B:
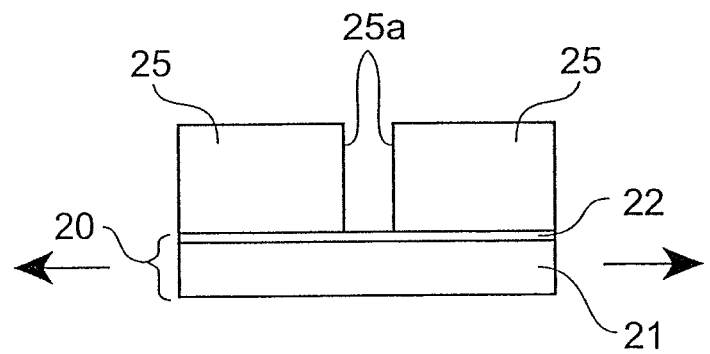
Figure 21A:
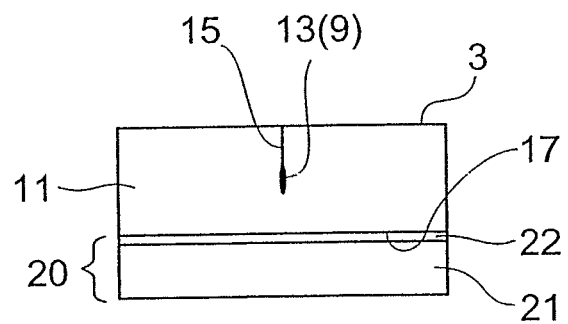
Figure 21B:
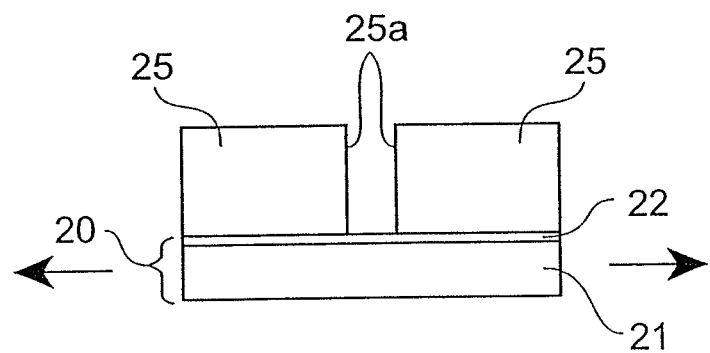
Figure 22A:
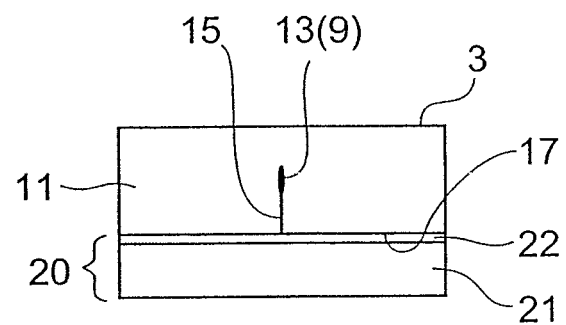
Figure 22B:
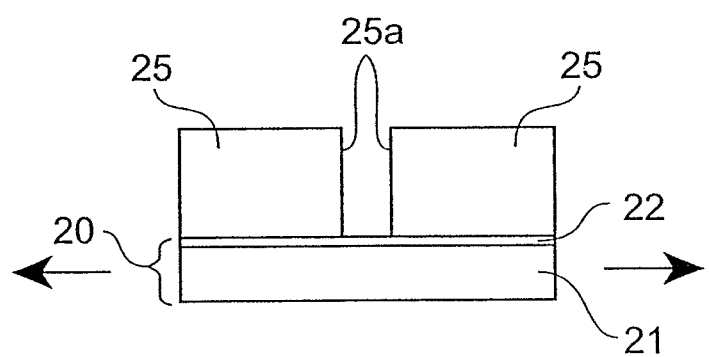

The method of cutting the silicon wafer 11 by using the adhesive sheet 20 comprising the base 21 and UV-curable resin layer 22 is not limited to the case where no fractures starting from the part which is intended to be cut 9 occur in the silicon wafer 11 before expanding the adhesive sheet 20 as explained with reference to FIG. 19, but fractures 15 started from the part which is intended to be cut 9 may be allowed to reach the front face 3 and rear face 17 of the silicon wafer 11 (FIG. 20A) before expanding the adhesive sheet 20 (FIG. 20B) as shown in FIGS. 20A and 20B. Also, a fracture 15 started from the part which is intended to be cut 9 may be allowed to reach the front face 3 of the silicon wafer 11 (FIG. 21A) before expanding the adhesive sheet 20 (FIG. 21B) as shown in FIG. 21, or a fracture 15 started from the part which is intended to be cut 9 may be allowed to reach the rear face 17 of the silicon wafer 11 (FIG. 22A) before expanding the adhesive sheet 20 (FIG. 22B) as shown in FIG. 22.

In the following, a preferred second embodiment of the method of cutting a semiconductor substrate in accordance with the present invention will be explained more specifically. FIGS. 24 to 27 are partly sectional views of the silicon wafer taken along the line XIII-XIII of FIG. 21

Figure 23:
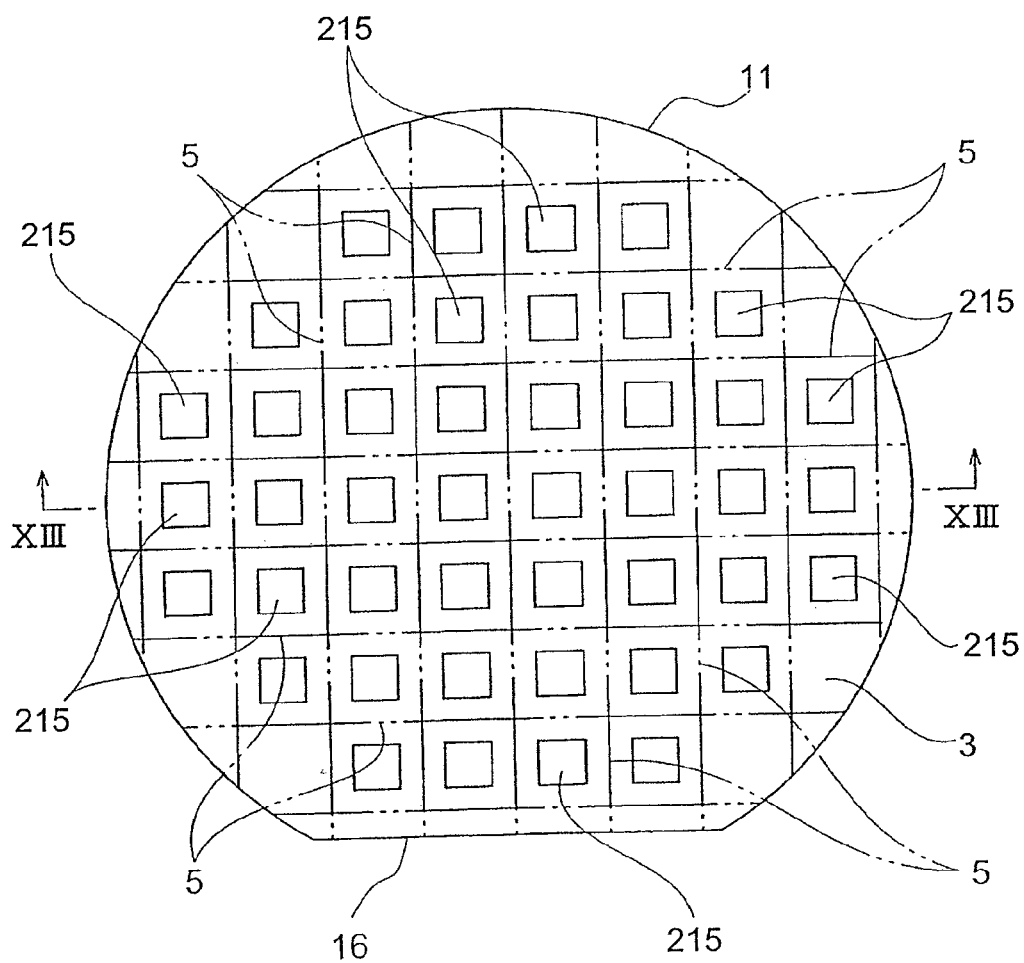
FIG. 23 is a plan view of a silicon wafer to become an object to be processed in the method of cutting a semiconductor substrate in accordance with an embodiment.

On the front face 3 of a silicon wafer (semiconductor substrate) 11 to become an object to be processed, a plurality of functional devices 215 are patterned into a matrix in directions parallel and perpendicular to an orientation flat 16 as shown in FIG. 23. In the following manner, such a silicon wafer 11 is cut into the functional devices 215.

Figure 24A:
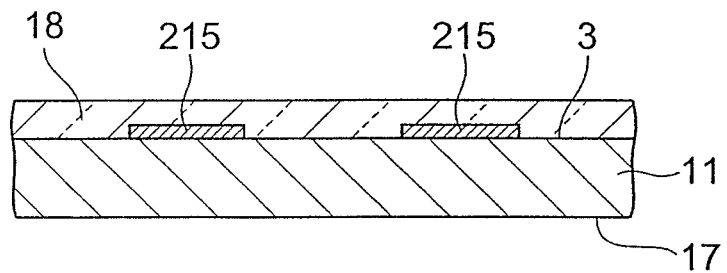
Figure 24B:
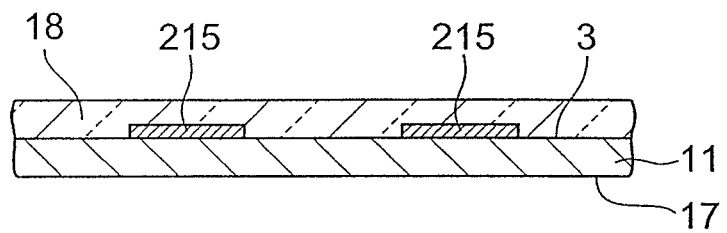
Figure 24C:
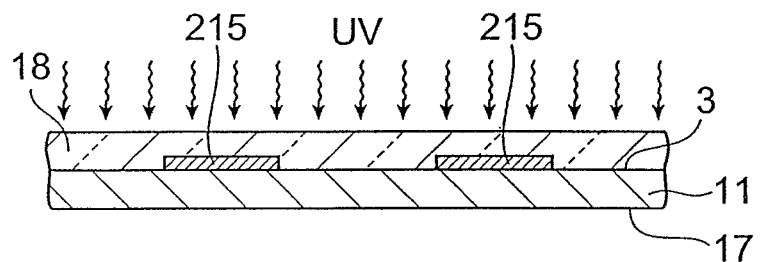

First, as shown in FIG. 24A, a protective film 18 is bonded to the silicon wafer 11 on, the front face 3 side, so as to cover the functional devices 215. The protective film 18 protects the functional devices 215 and holds the silicon wafer 11. After bonding the protective film 18, the rear face 17 of the silicon wafer 11 is ground to a plane such that the silicon wafer 11 attains a predetermined thickness, and is further subjected to chemical etching, so as to be smoothed as shown in FIG. 24B. As such, for example, the silicon wafer 11 having a thickness of 350 μm is thinned to a thickness of 100 μm. After the silicon wafer 11 is thinned, the protective film 18 is irradiated with UV rays. This hardens the UV-curable resin layer, which is an adhesive layer in the protective film 18, thereby making it easier for the protective film 18 to peel off.

Figure 25A:
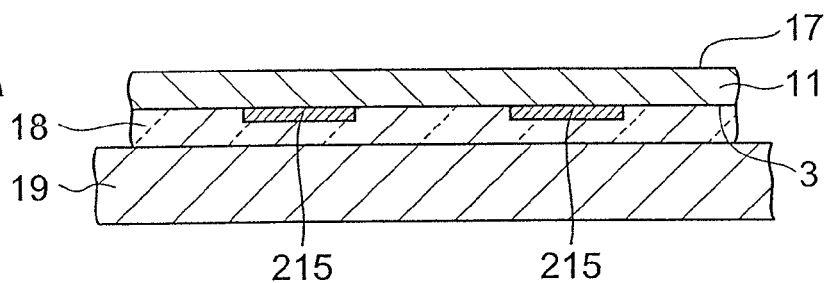
Figure 25B:
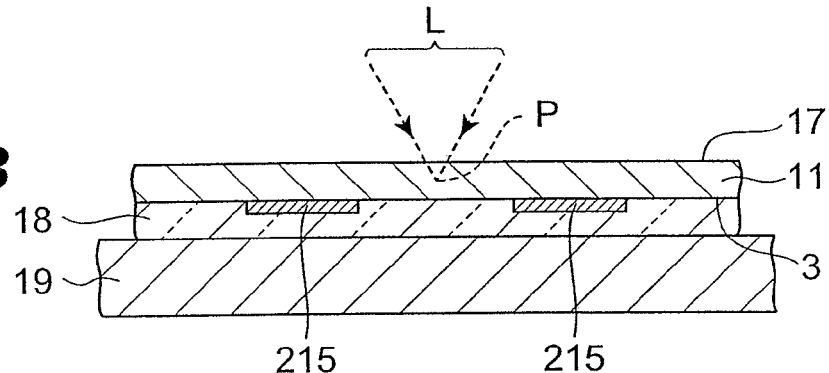
Figure 25C:
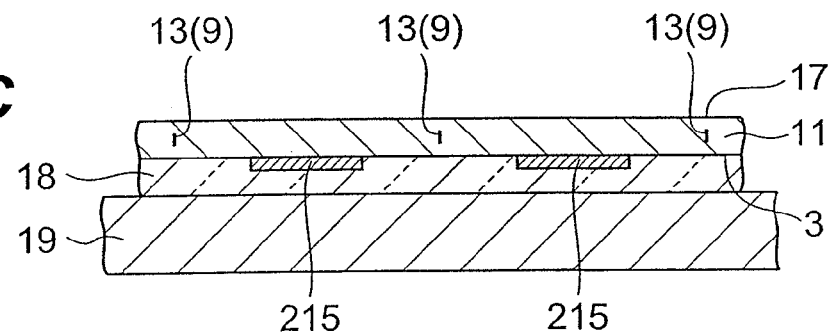

Subsequently, using a laser processing apparatus, a cutting start region is formed within the silicon wafer 11. Namely, as shown in FIG. 25A, the protective film 18 is secured onto the mount table 19 of the laser processing apparatus by vacuum suction such that the rear face 17 of the silicon wafer 11 faces up, and lines to cut 5 are set like grids so as to pass between neighboring functional devices 215, 215 (see dash-double-dot lines in FIG. 23). Then, as shown in FIG. 25B, the silicon wafer 11 is irradiated with laser light L while using the rear face 17 as a laser light entrance surface and locating the light-converging point P within the silicon wafer 11 under a condition generating the above-mentioned multiphoton absorption, and the mount table 19 is moved, such that the light-converging point P is relatively shifted along the lines to cut 5. Consequently, as shown in FIG. 25C, cutting start regions 8 are formed by molten processed regions 13 within the silicon wafer 11 along the lines to cut 5.

Figure 26A:
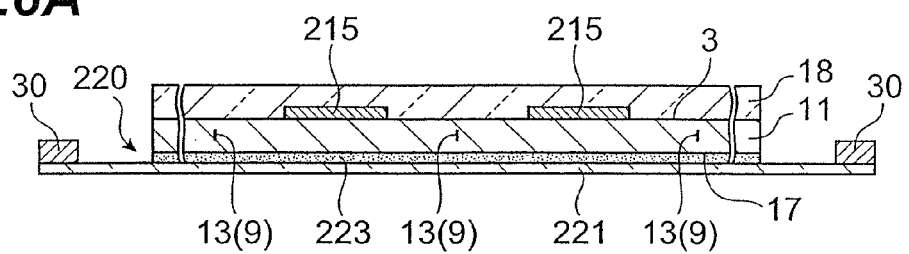
Figure 26B:
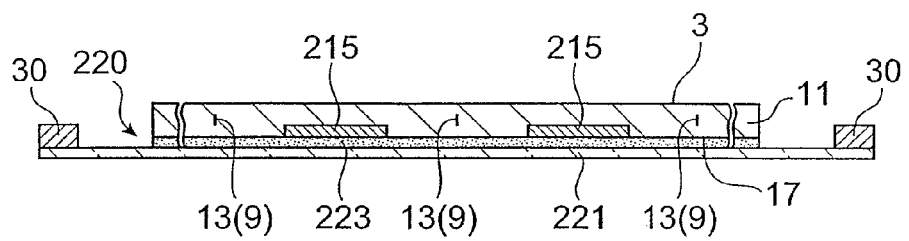
Figure 26C:
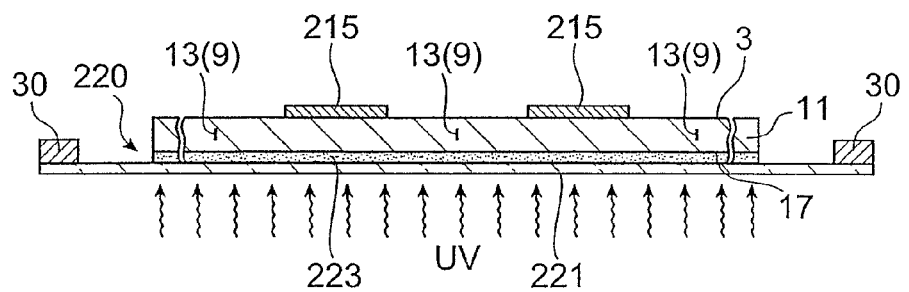

Next, the silicon wafer 11 having the protective film 18 bonded thereto is removed from the mount table 19, and a die-bonding-resin-attached film 220 (e.g., "LE-5000 (product name)" available from Lintec Corporation) is bonded to the rear face 17 of the silicon wafer 11 as shown in FIG. 26A. The die-bonding-resin-attached film 220 includes an expandable film (holding member) 221 having a thickness of about 100 μm, whereas a die-bonding resin layer 223 functioning as a die-bonding adhesive is disposed on the expandable film 221 by way of a UV-curable resin layer having a thickness on the order of several micrometers. Namely, the expandable film 221 is bonded to the rear face 17 of the silicon wafer 11 by way of the die-bonding resin layer 223. A film expanding means 30 is attached to a peripheral part of the expandable film 221. After bonding the die-bonding-resin-attached film 220, the protective film 18 is peeled off from the front face 3 side of the silicon wafer 11 as shown in FIG. 26B, and the expandable film 221 is irradiated with UV rays as shown in FIG. 26C. This hardens the UV-curable resin layer, which is an adhesive layer in the expandable film 221, thereby making it easier for the die-bonding resin layer 223 to peel off from the expandable film 221.

Figure 27A:
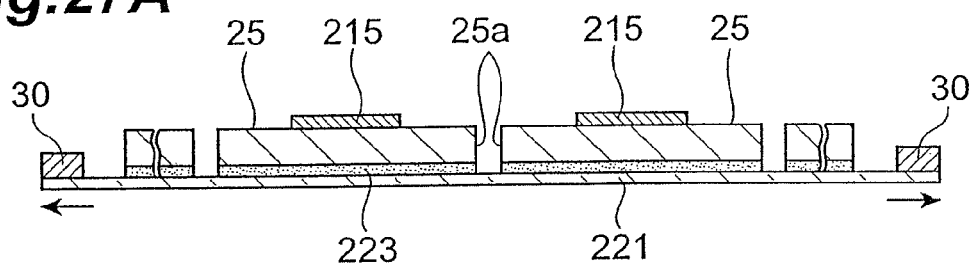

Subsequently, as shown in FIG. 27A, the film expanding means 30 pulls the peripheral part of the expandable film 221 outward, so as to expand the expandable film 221. Expanding the expandable film 221 causes fractures to start from the cutting start regions 8 and reach the front face 3 and rear face 17 of the silicon wafer 11. As a consequence, the silicon wafer 11 is cut along the lines to cut 5 with a high precision, whereby a plurality of semiconductor chips 25 each including one functional device 215 are obtained. Here, the opposing cut sections 25a, 25a of the neighboring semiconductor chips 25, 25 are separated from each other from their close contact state as the expandable film 221 expands, whereby the die-bonding resin layer 223 in close contact with the rear face 17 of the silicon wafer 11 is cut along the lines to cut 5 together with the silicon wafer 11.

Figure 27B:
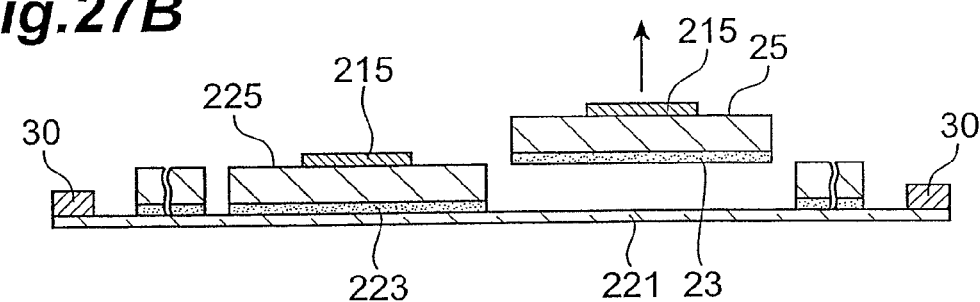
Figure 27C:
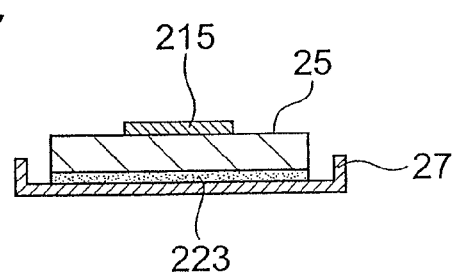

Next, using a vacuum collet or the like, the semiconductor chips 25 are successively picked up as shown in FIG. 27B. Here, the die-bonding resin layer 23 is cut into outer forms similar to those of the semiconductor chips 25, whereas the adhesive force between the die-bonding resin layer 223 and expandable film 221 is lowered, whereby each semiconductor chip 25 is picked up while in a state where the cut die-bonding resin layer 223 is attached to its rear face. Then, as shown in FIG. 27C, the semiconductor chip 25 is mounted on a die pad of a lead frame 27 by way of the die-bonding resin layer 223 closely in contact with the rear face, and is joined thereto with the filler upon heating.

In the foregoing method of cutting the silicon wafer 11, the silicon wafer 11 having the front face 3 formed with the functional devices 215 is used as an object to be processed, and is irradiated with laser light L while using its rear face 17 as a laser light entrance surface and locating the light-converging point P within the silicon wafer 11. This generates multiphoton absorption within the silicon wafer 11, thereby forming the cutting start regions 8 caused by the molten processed regions 13 within the silicon wafer 11 along the lines to cut 5. Here, the rear face of the semiconductor substrate is used as the laser light entrance surface, since there will be a fear of the functional devices inhibiting the laser light from entering if the front face is used as the laser light entrance surface. When the cutting start regions 8 are formed within the silicon wafer 11 as such, fractures can start from the cutting start regions 8 naturally or with a relatively small force applied thereto, so as to reach the front face 3 and rear face 17 of the silicon wafer 11. Therefore, when the expandable film 221 is bonded to the rear face 17 of the silicon wafer 11 by way of the die-bonding resin layer 223 and expanded after forming the cutting start regions 8, the cut sections 25a, 25a of the silicon wafer 11 cut along the lines to cut 5 are separated from each other from their close contact state. As a consequence, the die-bonding resin layer 223 existing between the silicon wafer 11 and expandable film 221 is also cut along the lines to cut 5. Therefore, the silicon wafer 11 and die-bonding resin layer 223 can be cut along the lines to cut 5 much more efficiently than in the case cut with a blade or the like.

Since the cut sections 25a, 25a of the silicon wafer 11 cut along the lines to cut 5 are initially in close contact with each other, the cut pieces of silicon wafer 11 and cut pieces of die-bonding resin layer 223 have substantially the same outer form, whereby the die-bonding resin is prevented from protruding from the cut sections 25a of the pieces of the silicon wafer 11.

Further, before forming the cutting start regions 8 within the silicon wafer 11, the rear face 17 of the silicon wafer 11 is ground such that the silicon wafer 11 attains a predetermined thickness. When the silicon wafer 11 is thinned to a predetermined thickness as such, the silicon wafer 11 and die-bonding resin layer 223 can be cut along the lines to cut 5 with a higher precision.

INDUSTRIAL APPLICABILITY

As explained in the foregoing, the method of cutting a semiconductor substrate in accordance with the present invention can efficiently cut the semiconductor substrate together with a die-bonding resin layer.

The invention claimed is:

1. A method of cutting a semiconductor substrate, the method comprising the steps of:
    irradiating a semiconductor substrate with laser light having a wavelength that enables the laser light to transmit through a laser incident surface of the semiconductor substrate, thereby forming a modified region only within the semiconductor substrate along each of a plurality of cutting lines arranged in a matrix with respect to at least one of a front and a rear surface of the semiconductor substrate, wherein each modified region is a molten processed region separated from the laser incident surface in a thickness direction of the semiconductor substrate, and each modified region forms a cutting area of the semiconductor substrate to be cut; and
    expanding a sheet, after the cutting areas of the semiconductor substrate are formed by the irradiation step, by pulling peripheral portions of the sheet outwardly, thereby cutting and separating at least the semiconductor substrate along the cutting lines where the cutting areas have been formed, the sheet being bonded to the semiconductor substrate.

2. A method of cutting a semiconductor substrate according to claim 1, wherein opposing cut sections of neighboring semiconductor substrates are separated from each other from a close contact state as the sheet expands.

3. A method of cutting a semiconductor substrate according to claim 1, wherein the front face of the semiconductor substrate is used as the laser incident surface.

4. A method of cutting a semiconductor substrate according to claim 1, wherein the rear face is used as the laser incident surface.

5. A method of cutting a semiconductor substrate according to claim 1, wherein no fractures are started from the cutting areas.

6. A method of cutting a semiconductor substrate according to claim 1, wherein a fracture is caused to reach the front face of the semiconductor substrate from the cutting areas acting as a start point.

7. A method of cutting a semiconductor substrate according to claim 1, wherein a protective film is bonded thereto by way of a die-bonding resin layer.

8. A method of cutting a semiconductor substrate according to claim 1, wherein the protective film is peeled off from the front face side of the semiconductor substrate, before the expanding of the sheet.

9. A method of cutting a semiconductor substrate according to claim 1, wherein a plurality of functional devices are formed like a matrix on the front face of the semiconductor substrate
    and wherein in forming the cutting areas the laser light is emitted so as to run between the plurality of functional devices arranged like matrix on the front surface of the semiconductor substrate, whereby the cutting areas are formed like a grid running directly under and between neighboring functional devices.

10. A method of cutting a semiconductor substrate according to claim 1, wherein the semiconductor substrate and the die-bonding resin layer are cut by the expanding of the sheet.

11. A method of cutting a semiconductor substrate according to claim 9, wherein the semiconductor substrate is cut into the functional devices.

12. A method of cutting a semiconductor substrate according to claim 1, wherein the front face is formed with a functional device along the cutting line,
    the method further comprising,
    attaching the sheet to the rear face of the semiconductor substrate by way of a die-bonding resin layer after forming the cutting areas, and
    expanding the sheet after attaching the sheet, so as to cut and separate the semiconductor substrate and die-bonding resin layer along the cutting line.

* * * * *